US010680406B2

(12) United States Patent
Ono et al.

(10) Patent No.: US 10,680,406 B2
(45) Date of Patent: Jun. 9, 2020

(54) SEMICONDUCTOR LASER, ELECTRONIC APPARATUS, AND METHOD OF DRIVING SEMICONDUCTOR LASER

(71) Applicant: SONY CORPORATION, Tokyo (JP)

(72) Inventors: Tomoki Ono, Kanagawa (JP);
Toyoharu Oohata, Tokyo (JP);
Takahiro Koyama, Kanagawa (JP);
Mikio Takiguchi, Kanagawa (JP);
Masayuki Tanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/323,253

(22) PCT Filed: Jul. 12, 2017

(86) PCT No.: PCT/JP2017/025342
§ 371 (c)(1),
(2) Date: Feb. 4, 2019

(87) PCT Pub. No.: WO2018/037747
PCT Pub. Date: Mar. 1, 2018

(65) Prior Publication Data
US 2019/0173262 A1      Jun. 6, 2019

(30) Foreign Application Priority Data

Aug. 25, 2016  (JP) ................. 2016-164934

(51) Int. Cl.
*H01S 5/06*           (2006.01)
*H01S 5/0625*       (2006.01)
(Continued)

(52) U.S. Cl.
CPC .......... *H01S 5/0615* (2013.01); *H01S 5/0206* (2013.01); *H01S 5/0625* (2013.01);
(Continued)

(58) Field of Classification Search
CPC .... H01S 5/0615; H01S 5/0206; H01S 5/0625; H01S 5/06253; H01S 5/1017; H01S 5/22;
(Continued)

(56) References Cited

U.S. PATENT DOCUMENTS 4,563,765 A      1/1986  Tsang et al.
5,023,878 A      6/1991  Berthold et al.
(Continued)

FOREIGN PATENT DOCUMENTS

CN       101950922 A       1/2011
CN       102890943 A       1/2013
(Continued)

OTHER PUBLICATIONS

International Search Report and Written Opinion of PCT Application No. PCT/JP2017/025342, dated Aug. 29, 2017, 9 pages of ISRWO.

(Continued)

*Primary Examiner* — Armando Rodriguez
(74) *Attorney, Agent, or Firm* — Chip Law Group

(57) ABSTRACT

In a semiconductor laser according to an embodiment of the present disclosure, a ridge part has a structure in which a plurality of gain regions and a plurality of Q-switch regions are each disposed alternately with each of separation regions being interposed therebetween in an extending direction of the ridge part. The separation regions each have a separation groove that separates from each other, by a space, the gain region and the Q-switch region adjacent to each other. The separation groove has a bottom surface at a position, in a second semiconductor layer, higher than a part corresponding to a foot of each of both sides of the ridge part.

17 Claims, 38 Drawing Sheets

(51) Int. Cl.

| | | |
|---|---|---|
| *H01S 5/10* | (2006.01) | |
| *H01S 5/22* | (2006.01) | |
| *H01S 5/02* | (2006.01) | |
| *H01S 5/30* | (2006.01) | |
| *H01S 5/20* | (2006.01) | |
| *H01S 5/065* | (2006.01) | |
| *H01S 5/028* | (2006.01) | |
| *H01S 5/022* | (2006.01) | |
| *H01S 5/024* | (2006.01) | |
| *H01S 5/042* | (2006.01) | |
| *H01S 5/323* | (2006.01) | |

(52) U.S. Cl.
CPC ........ *H01S 5/06253* (2013.01); *H01S 5/1017* (2013.01); *H01S 5/22* (2013.01); *H01S 5/3086* (2013.01); *H01S 5/028* (2013.01); *H01S 5/0287* (2013.01); *H01S 5/02272* (2013.01); *H01S 5/02469* (2013.01); *H01S 5/0425* (2013.01); *H01S 5/0428* (2013.01); *H01S 5/0601* (2013.01); *H01S 5/0655* (2013.01); *H01S 5/1003* (2013.01); *H01S 5/1039* (2013.01); *H01S 5/209* (2013.01); *H01S 5/2072* (2013.01); *H01S 5/2086* (2013.01); *H01S 5/2202* (2013.01); *H01S 5/3054* (2013.01); *H01S 5/32316* (2013.01); *H01S 2304/04* (2013.01)

(58) Field of Classification Search
CPC .. H01S 5/2219; H01S 5/3086; H01S 5/02272; H01S 5/02469; H01S 5/028; H01S 5/0287; H01S 5/0425; H01S 5/0428; H01S 5/0427; H01S 5/0601; H01S 5/0655; H01S 5/1003; H01S 5/1039; H01S 5/2072; H01S 5/2086; H01S 5/209; H01S 5/2202; H01S 5/3054; H01S 5/32316; H01S 2304/14
See application file for complete search history.

(56) References Cited

U.S. PATENT DOCUMENTS

| | | | |
|---|---|---|---|
| 6,215,805 | B1 | 4/2001 | Sartorius et al. |
| 6,356,693 | B1 | 3/2002 | Shimizu et al. |
| 2004/0091009 | A1 | 5/2004 | Matsuda et al. |
| 2006/0227818 | A1 | 10/2006 | Gubenko et al. |
| 2011/0007765 | A1* | 1/2011 | Kuramoto ............. B82Y 20/00 |
| | | | 372/45.01 |
| 2013/0021425 | A1 | 1/2013 | Fujita et al. |

FOREIGN PATENT DOCUMENTS

| | | |
|---|---|---|
| EP | 0417989 A2 | 3/1991 |
| EP | 0890204 B1 | 12/1999 |
| EP | 1056169 A2 | 11/2000 |
| EP | 1952494 A1 | 8/2008 |
| JP | 01-262683 A | 10/1989 |
| JP | 03-106094 A | 5/1991 |
| JP | 05-090700 A | 4/1993 |
| JP | 10-229252 A | 8/1998 |
| JP | 2000-507744 A | 6/2000 |
| JP | 2000-338453 A | 12/2000 |
| JP | 2004-214603 A | 7/2004 |
| JP | 2005-039099 A | 2/2005 |
| JP | 2008-258274 A | 10/2008 |
| JP | 2011-018784 A | 1/2011 |
| JP | 2013-026351 A | 2/2013 |
| WO | 97/37406 A1 | 10/1997 |
| WO | 2006/108528 A1 | 10/2006 |

OTHER PUBLICATIONS

Extended European Seach Report for EP Patent Application No. 17843234.0, dated Oct. 2, 2019, 9 pages.
Martins-Filho, et al., "Monolithic Multiple Colliding Pulse Mode-Locked Quantum-Well Lasers: Experiment and Theory", IEEE Journal of Selected Topics in Quantum Electronics, Jun. 1995, No. 2, pp. 539-551.

* cited by examiner

[FIG. 1]
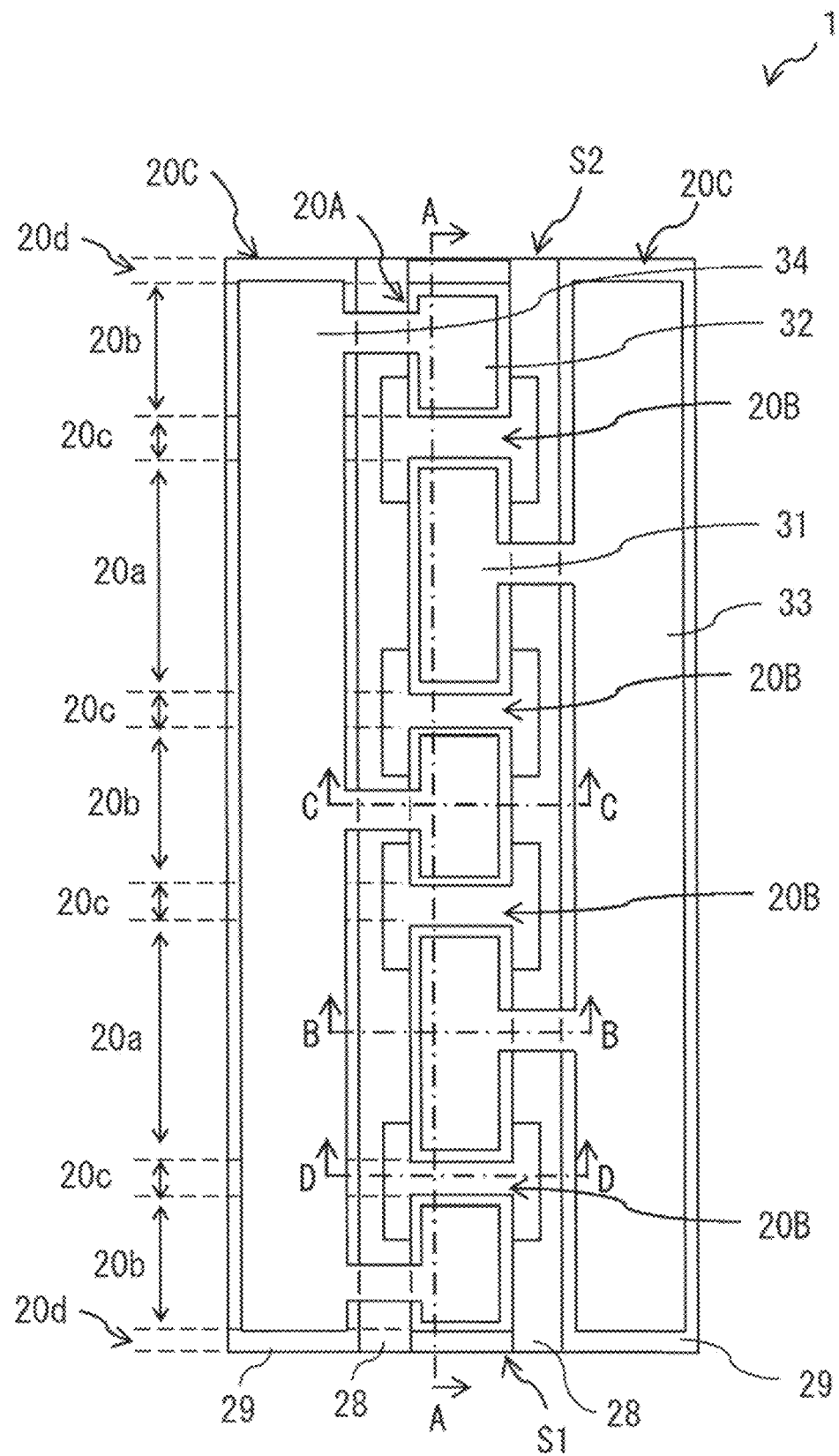

[FIG. 2]
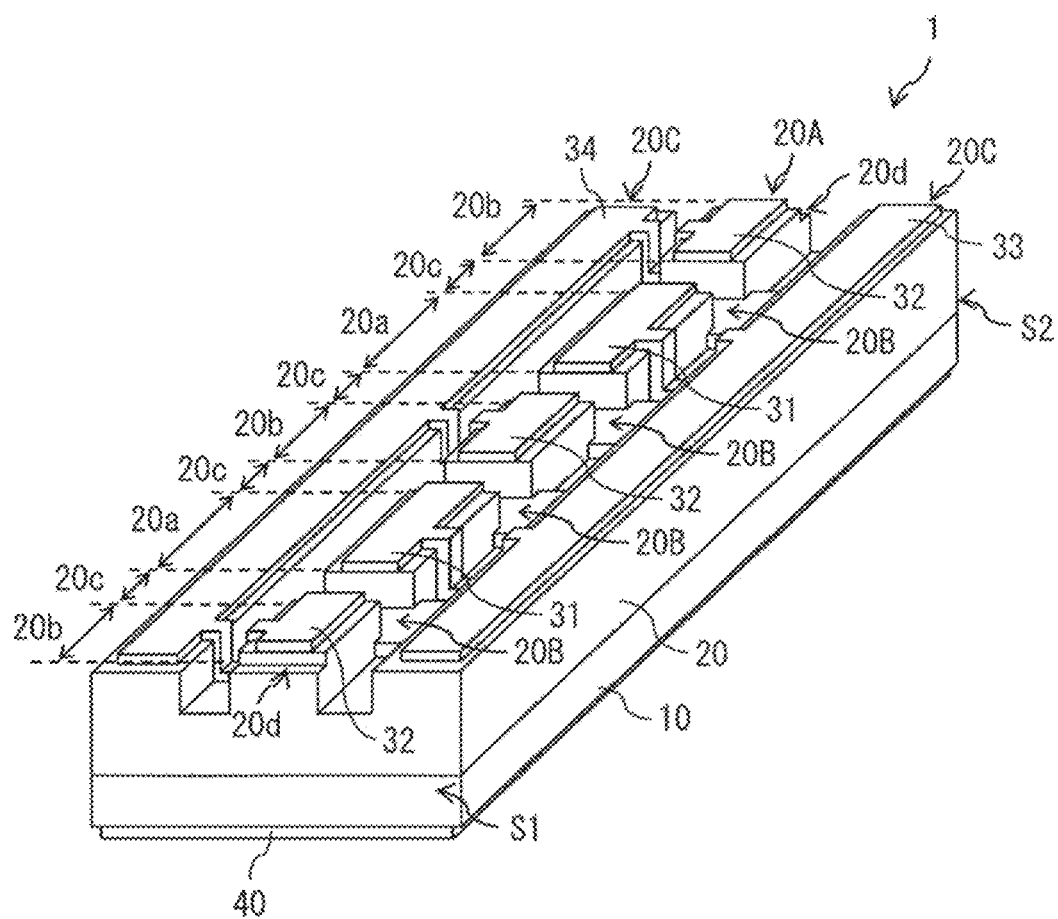

[FIG. 3]
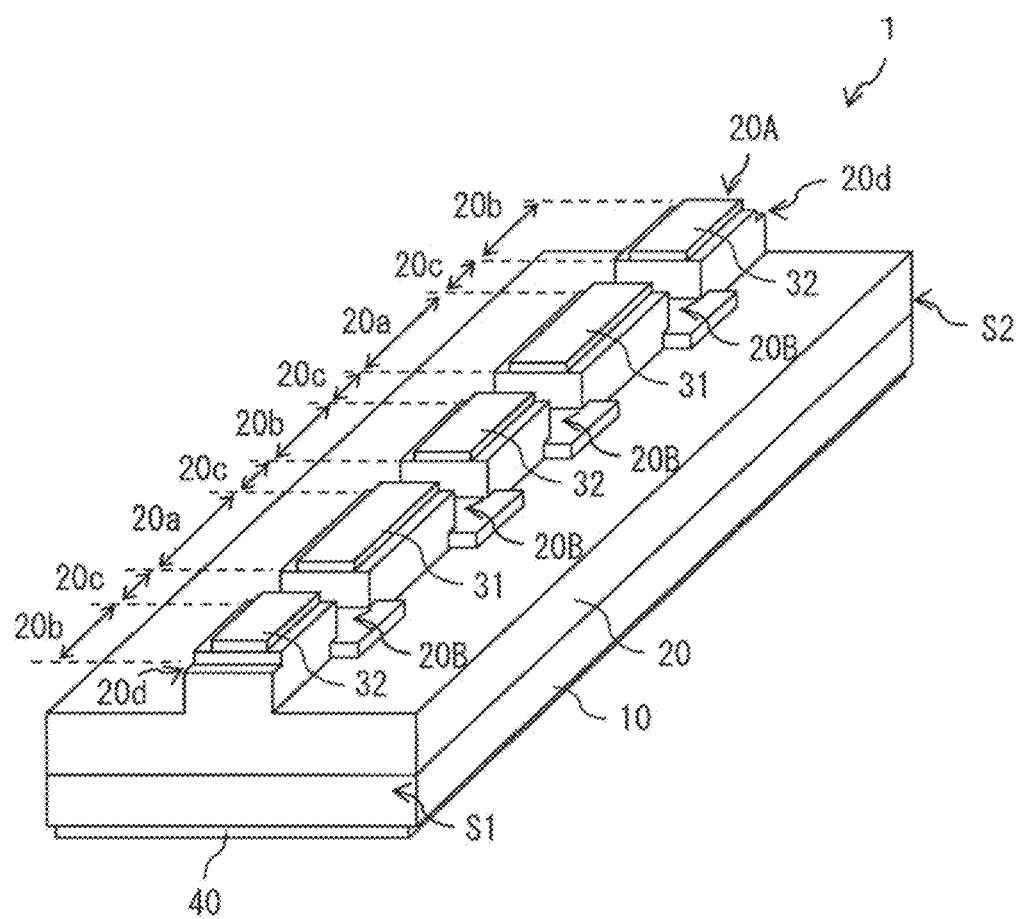

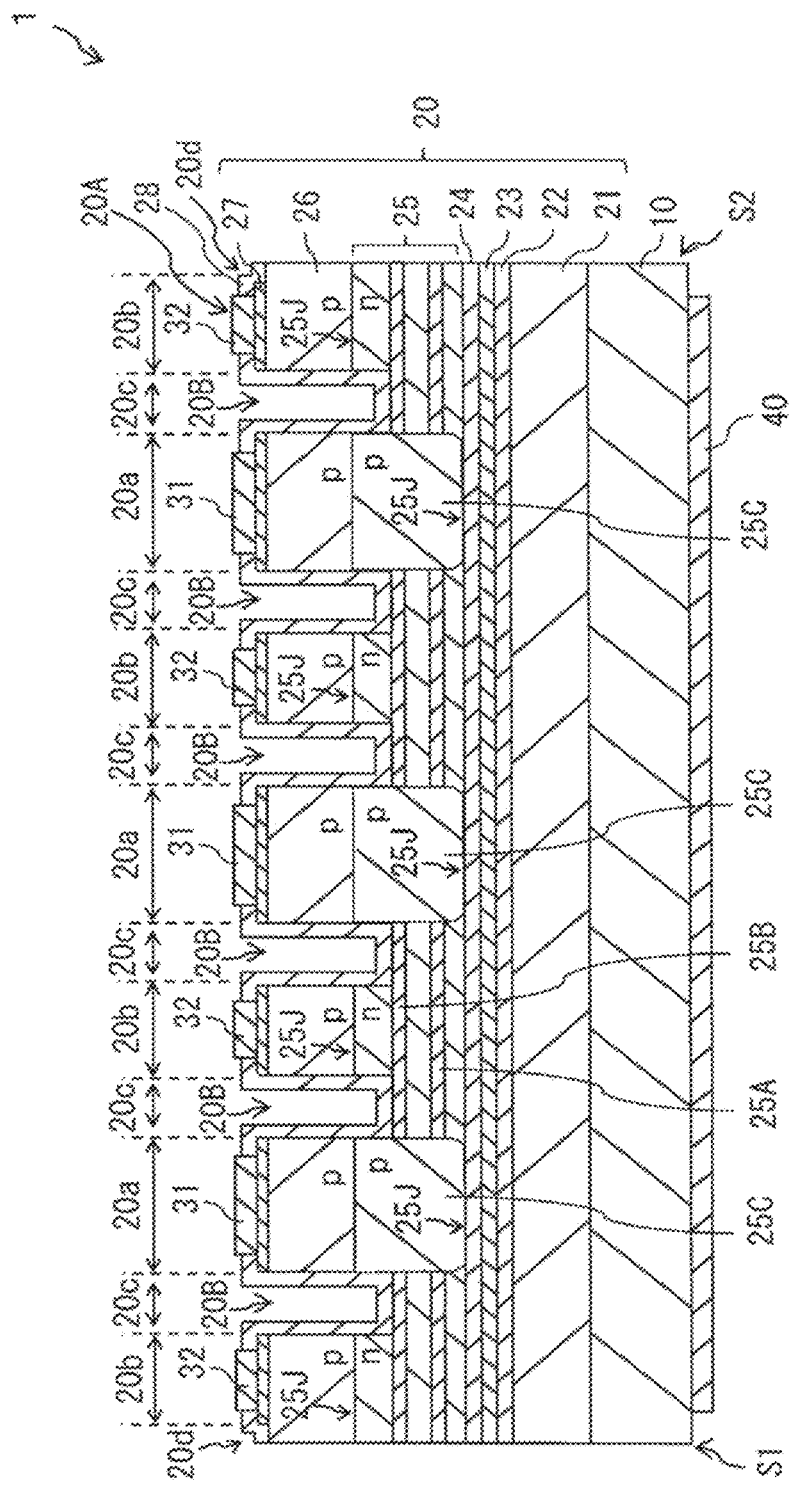
[FIG. 4]

[FIG. 5]
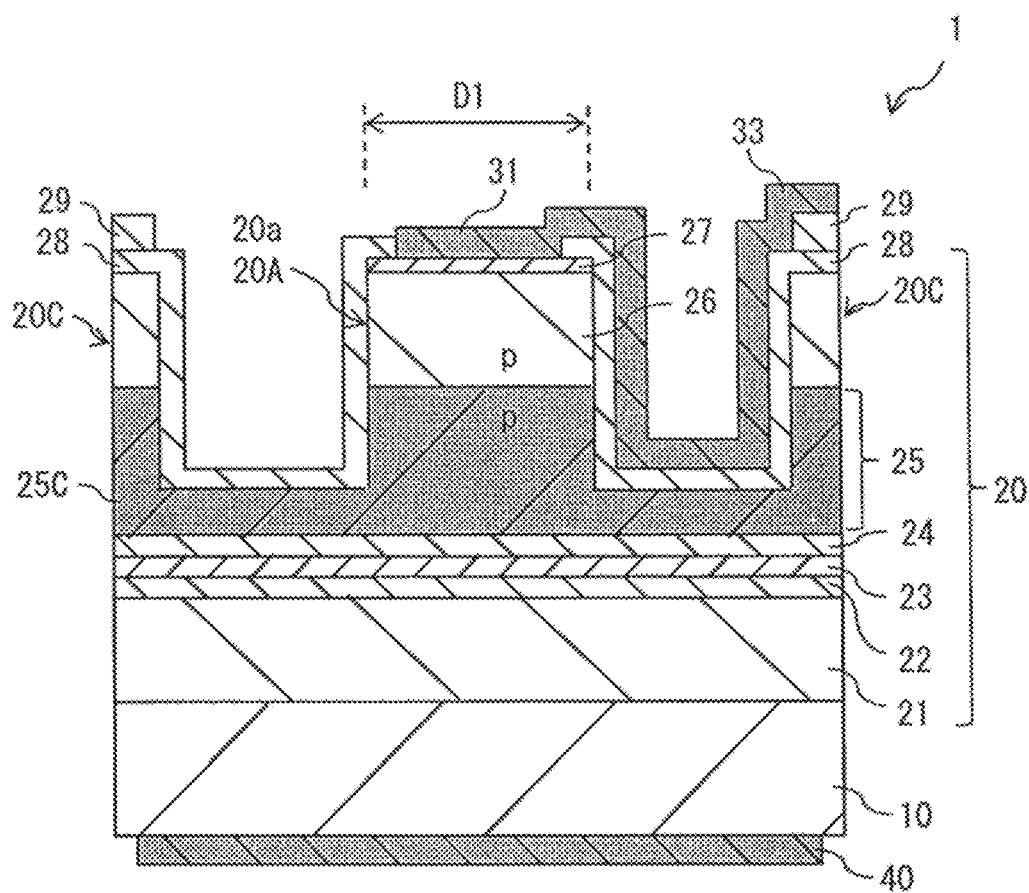

[FIG. 6]
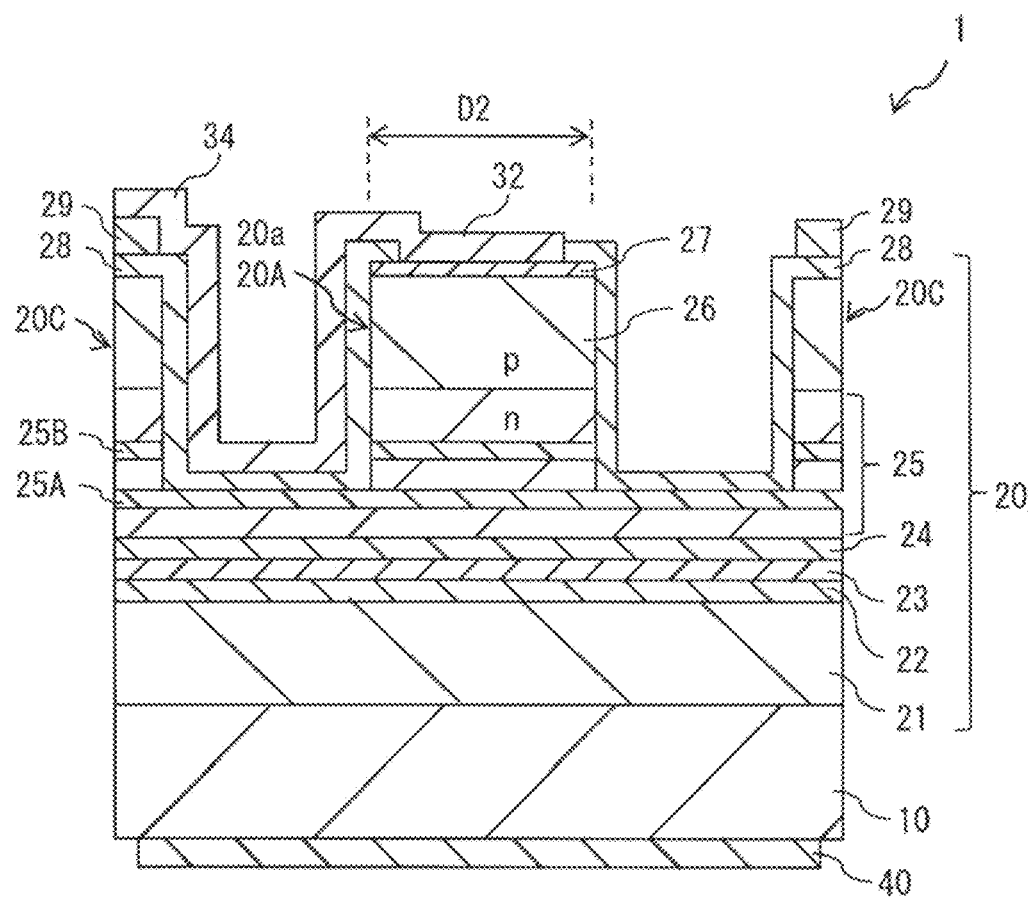

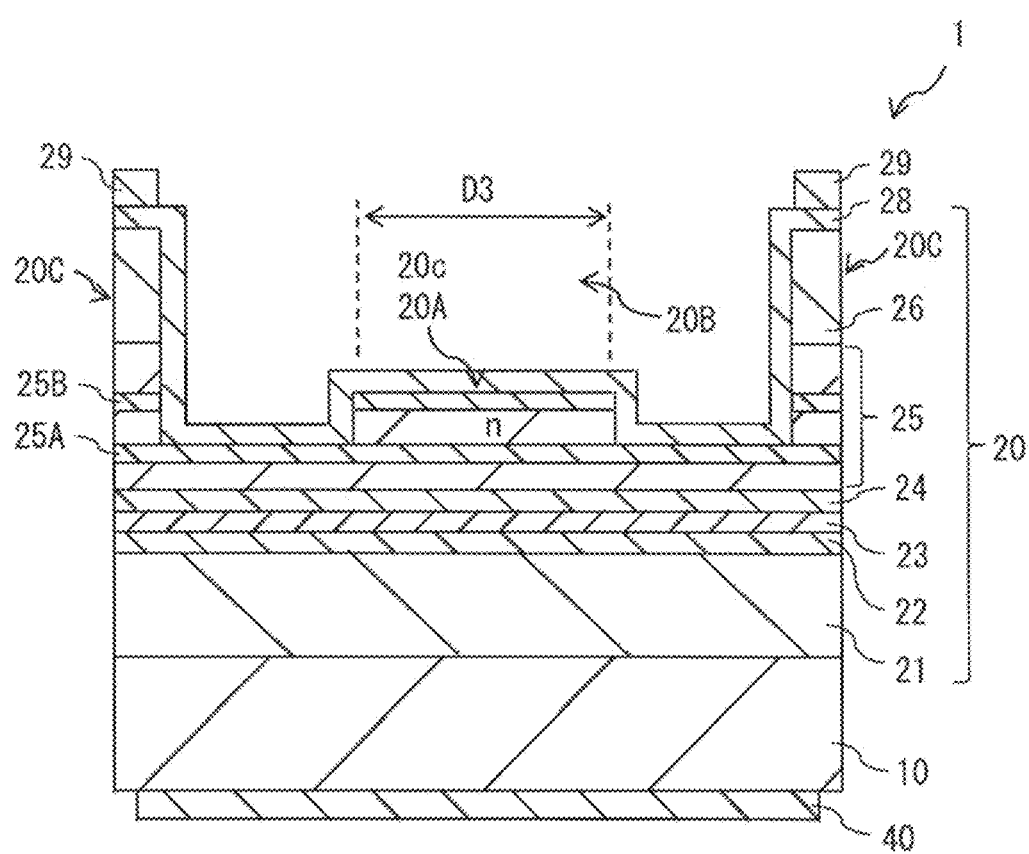
[FIG. 7]

[FIG. 8]
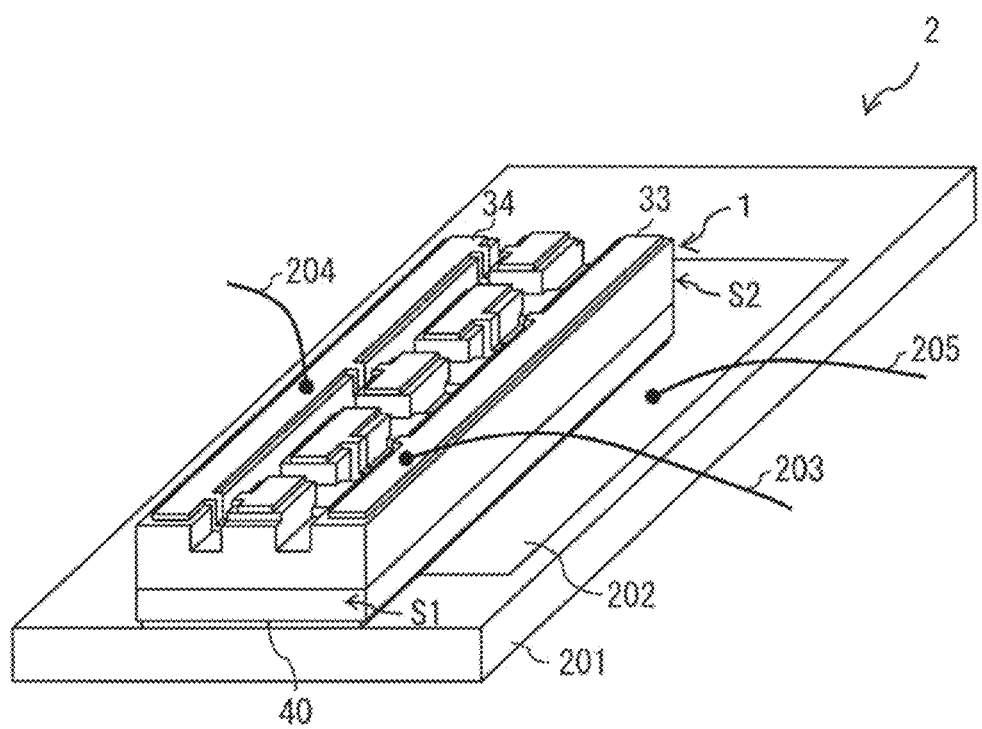

[FIG. 9]
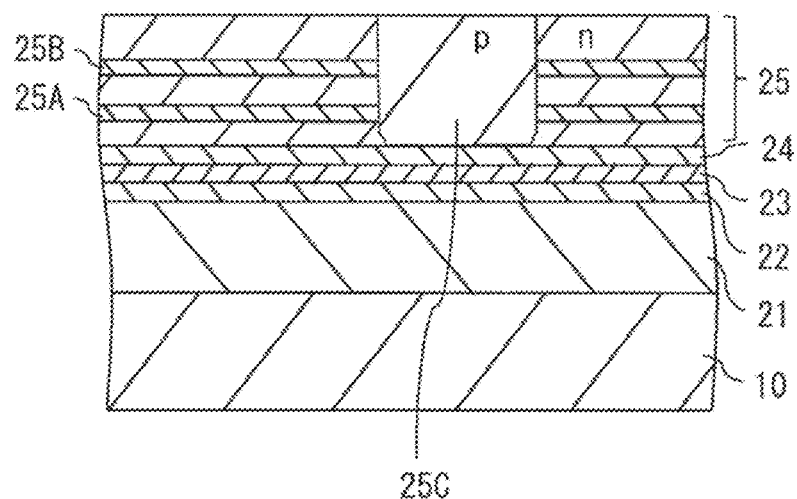
[FIG. 10]
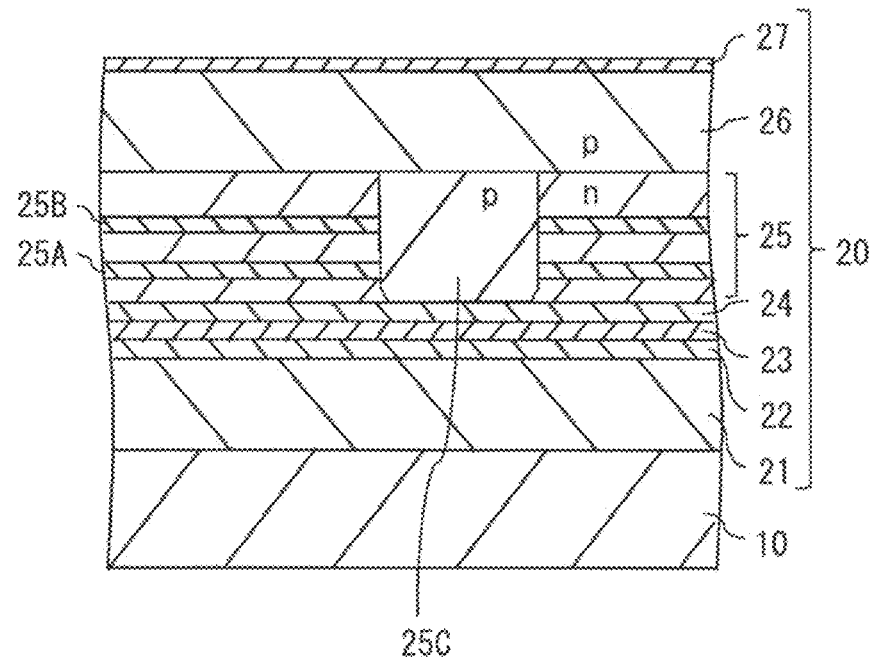

[FIG. 11]
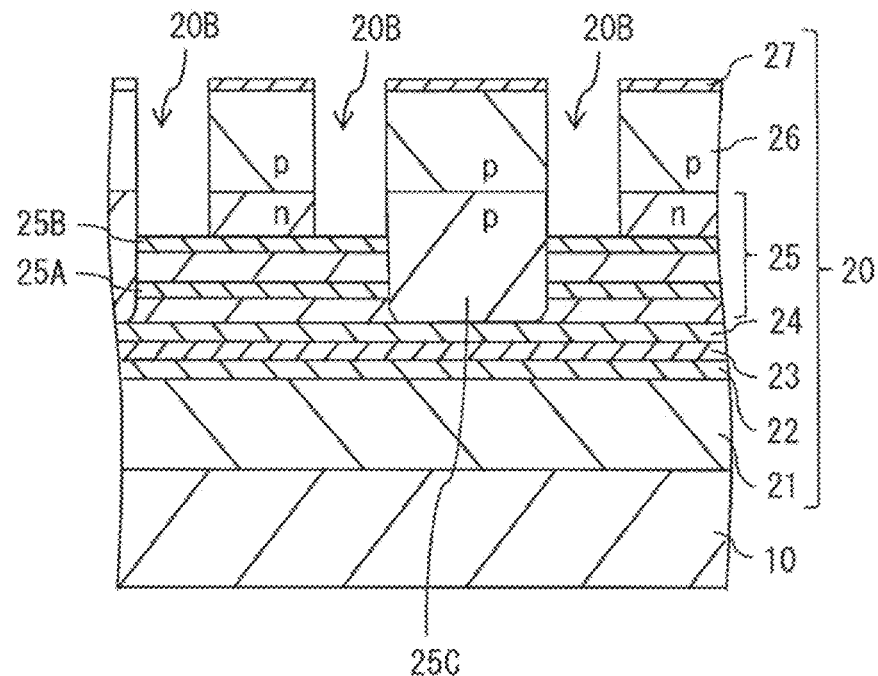
[FIG. 12A]
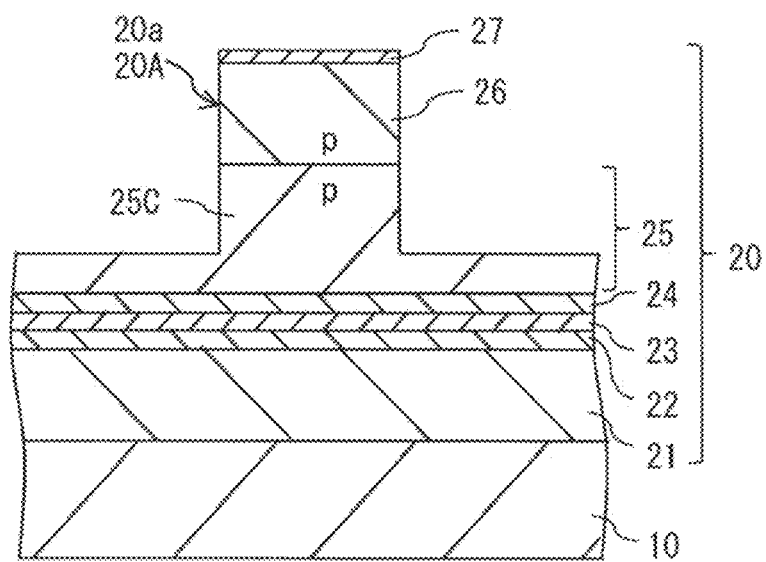

[ FIG. 12B ]
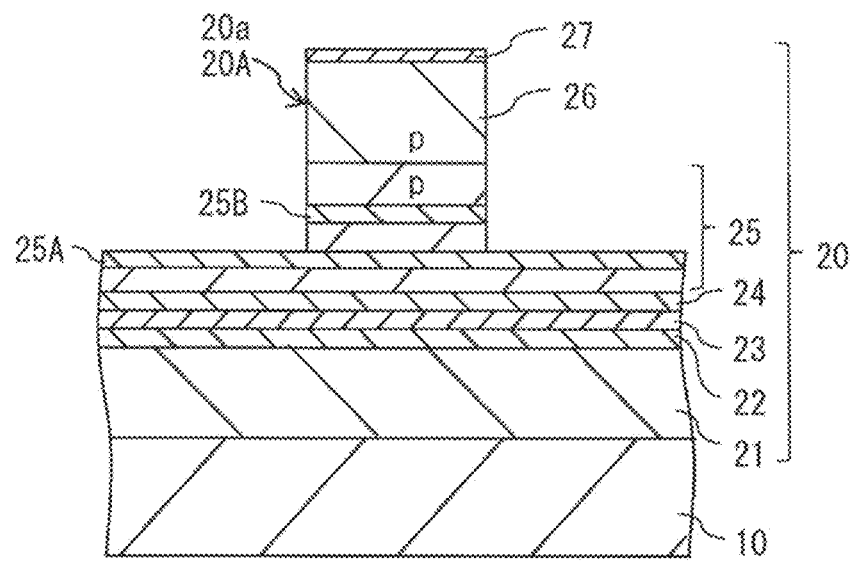
[ FIG. 12C ]
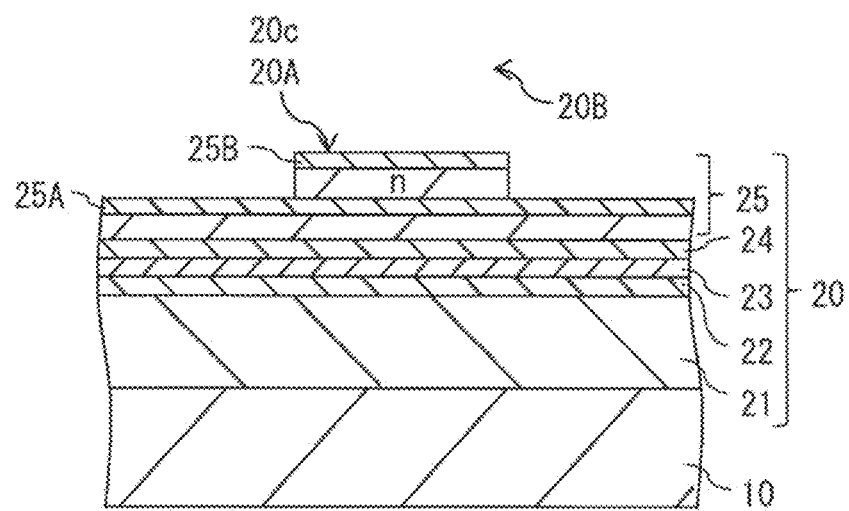

[ FIG. 13 ]
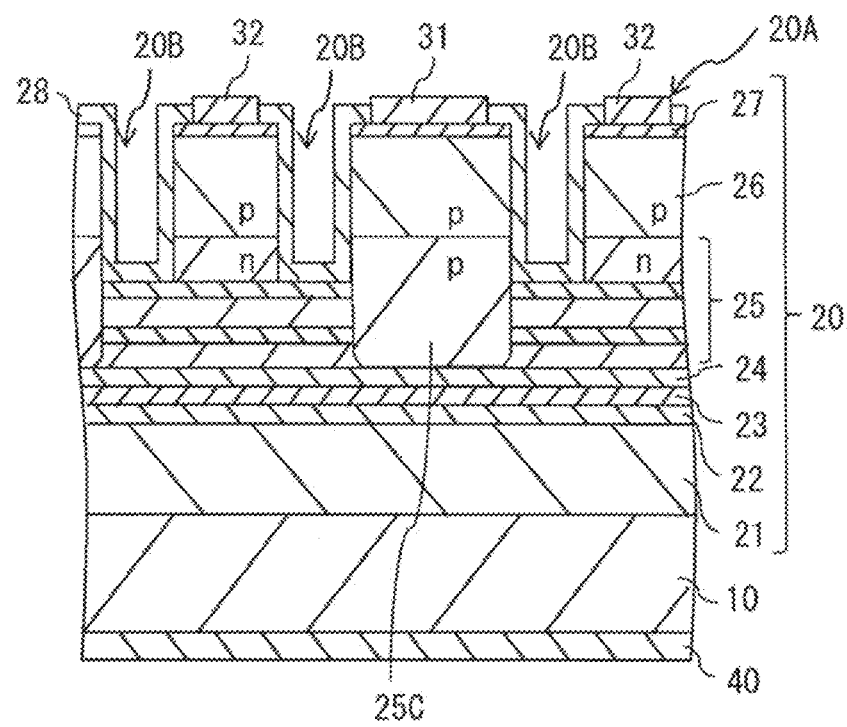

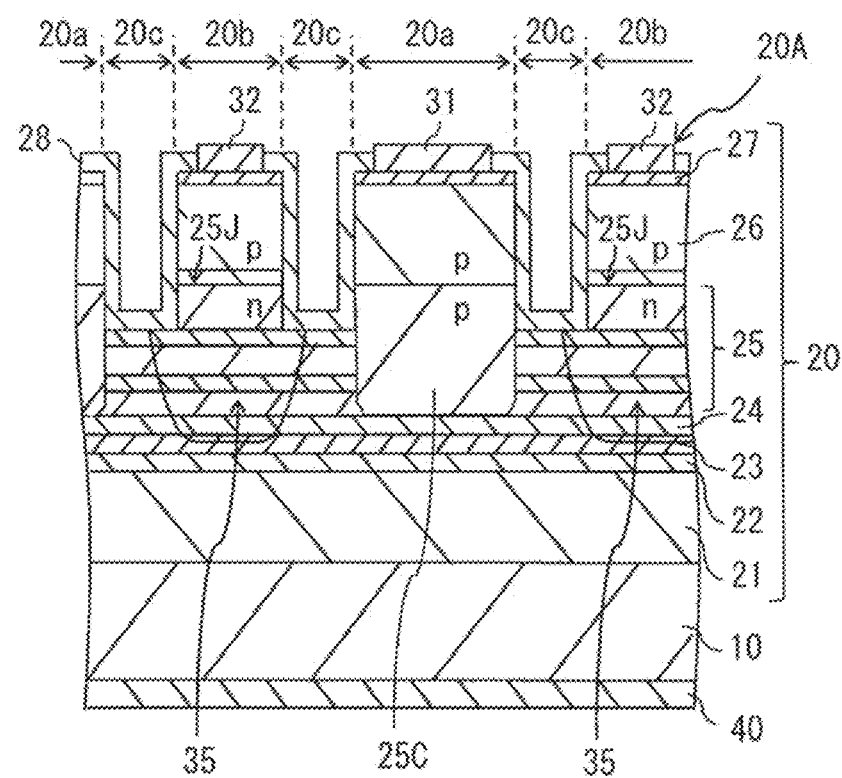
[FIG. 14]

[FIG. 15]
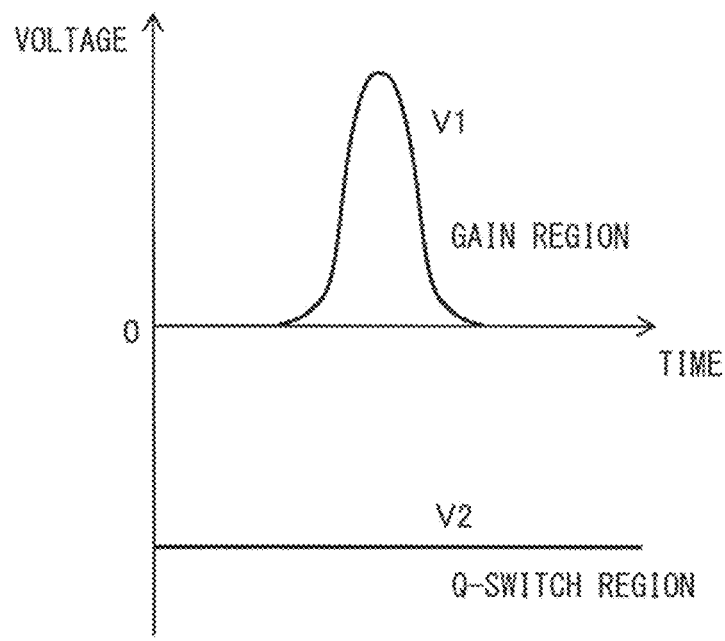
[FIG. 16]
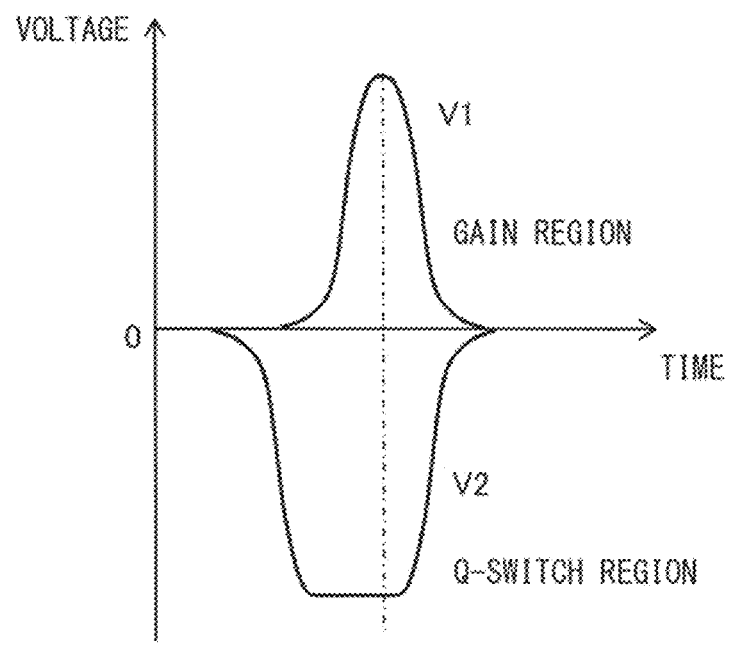

[ FIG. 17 ]
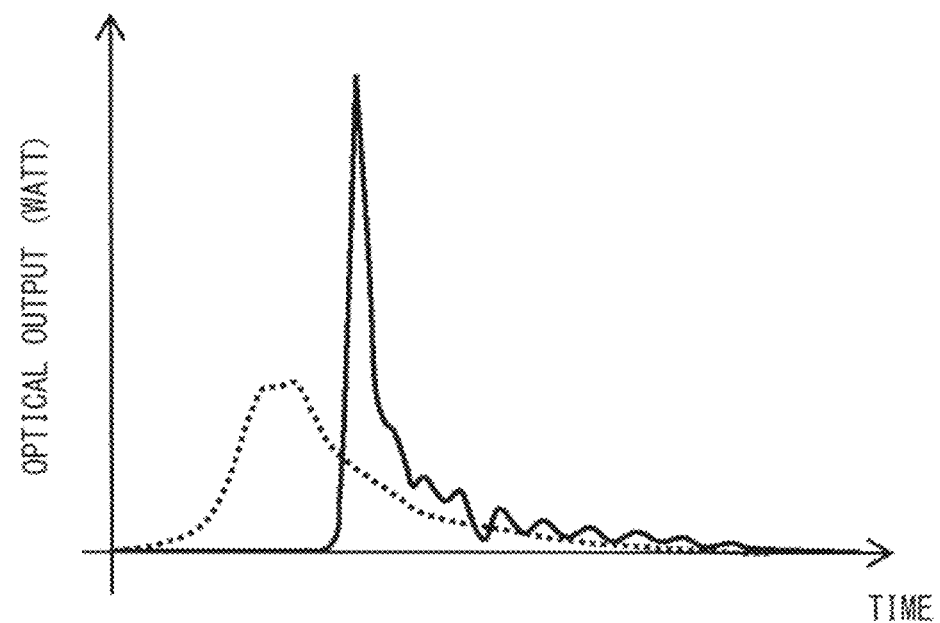
[ FIG. 18 ]
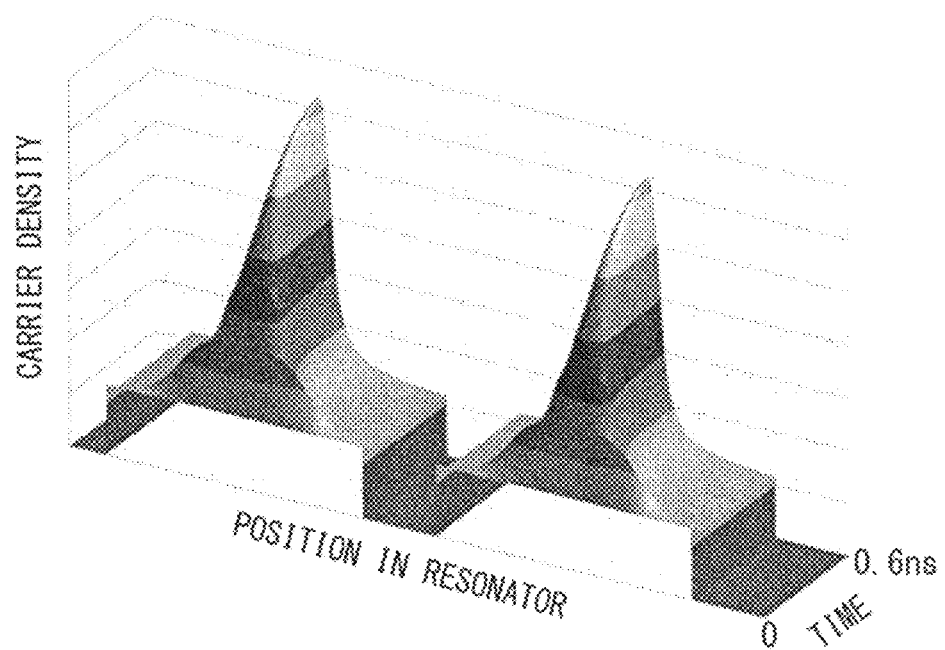

[ FIG. 19 ]
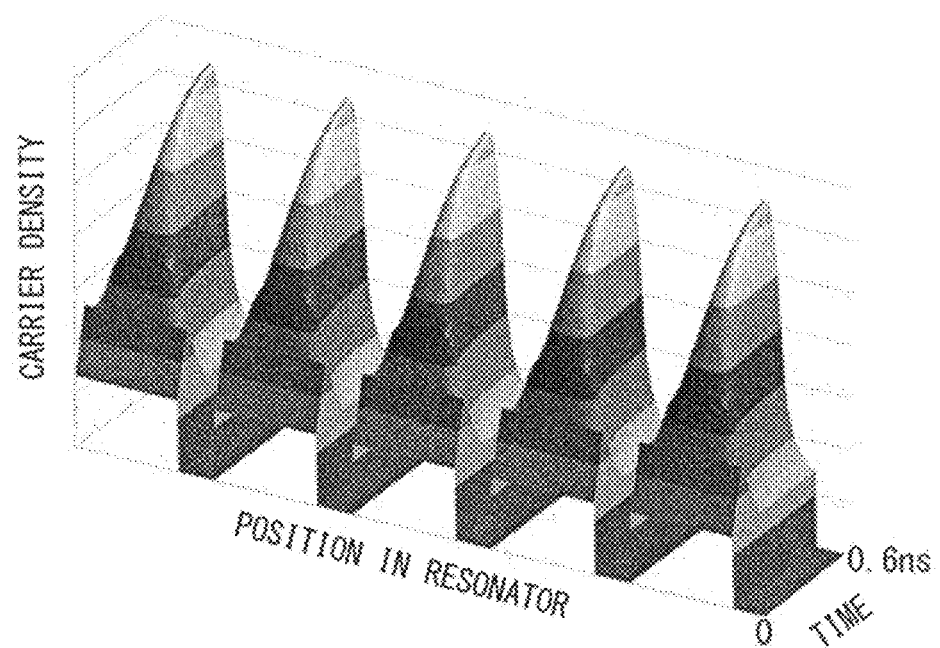
[ FIG. 20 ]
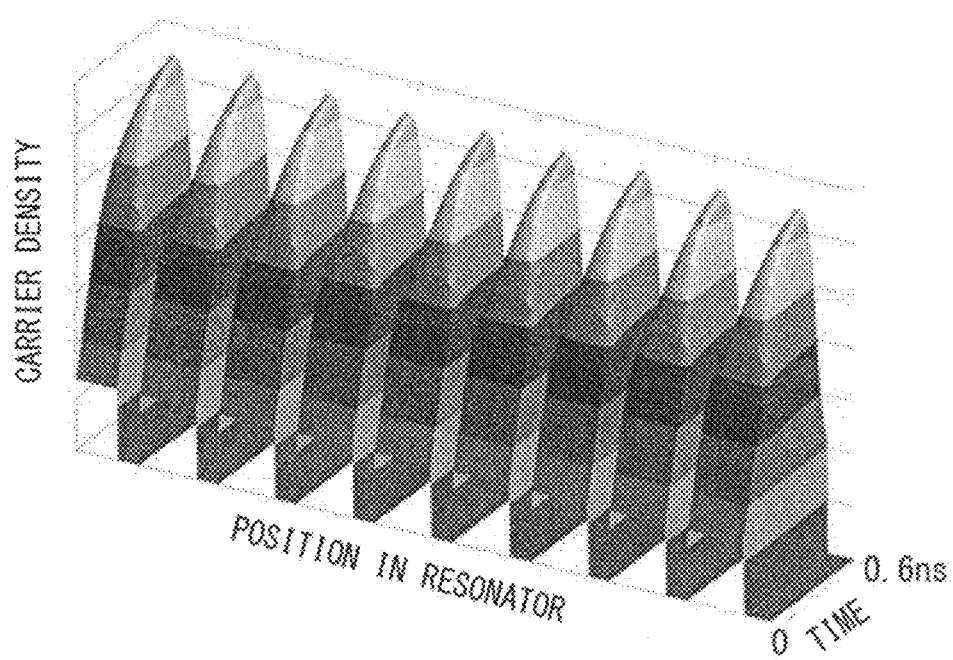

[FIG. 21]
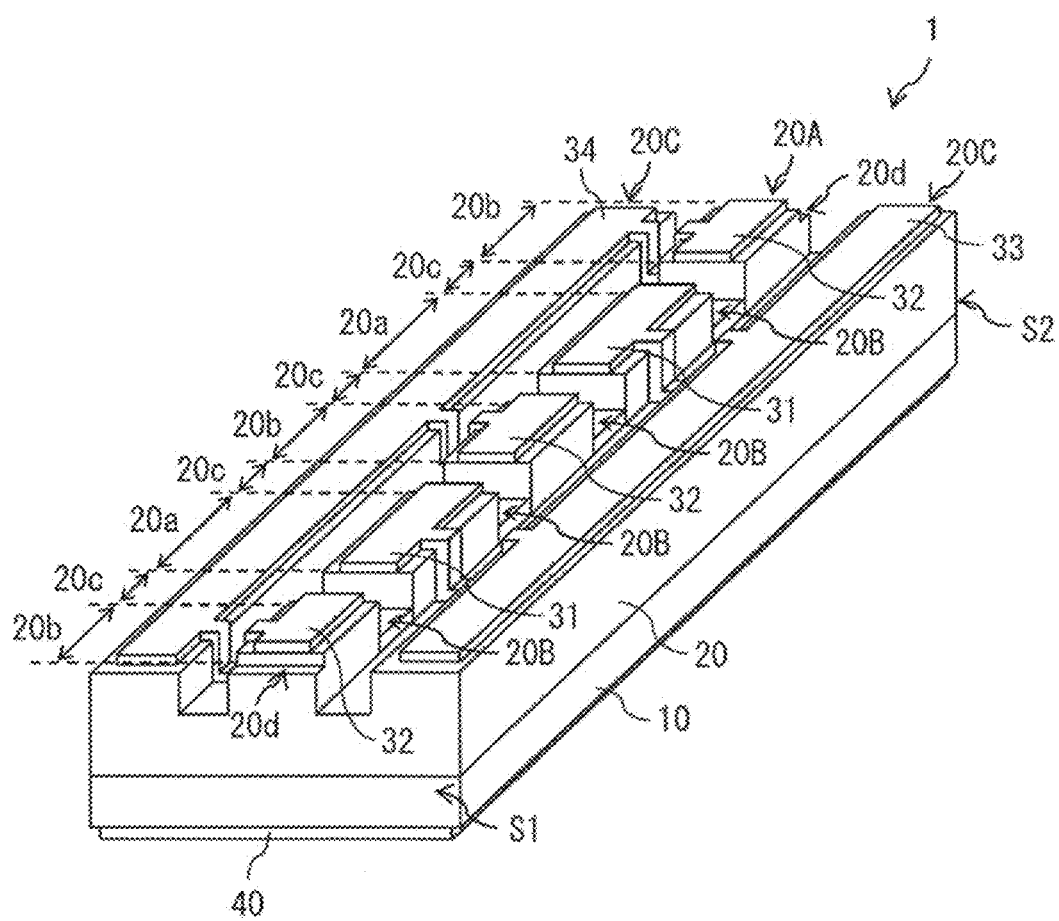

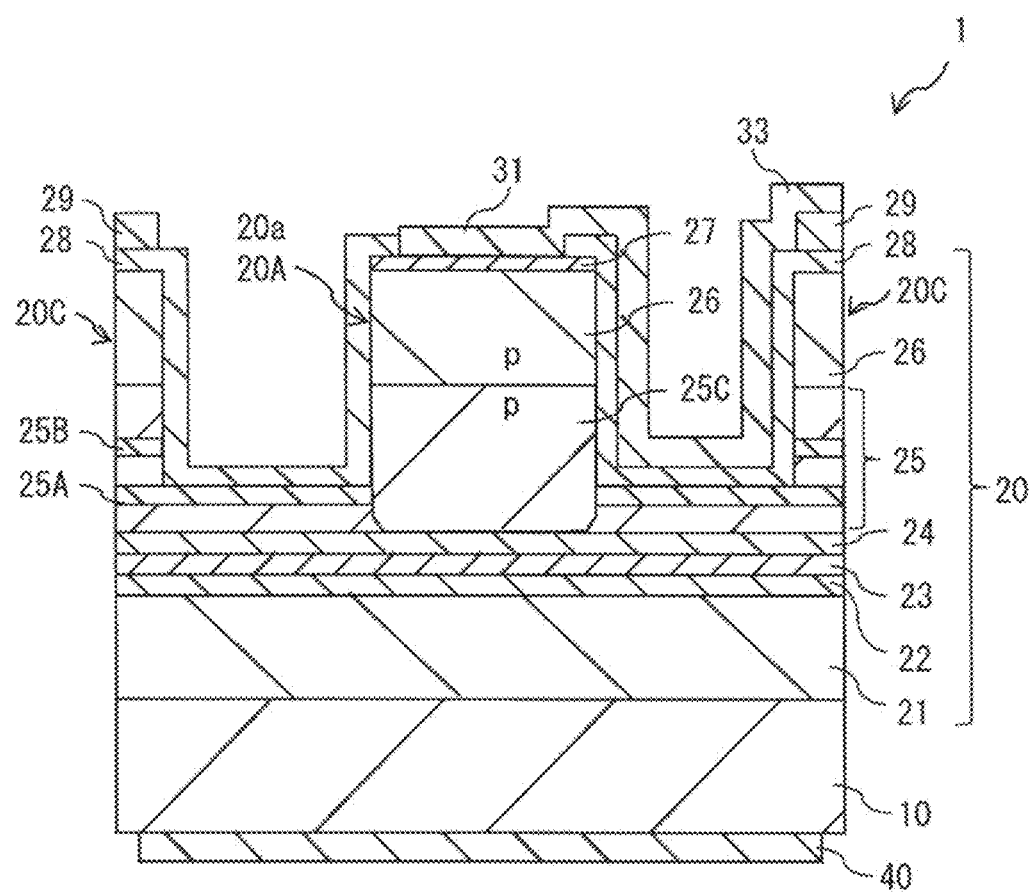
[FIG. 22]

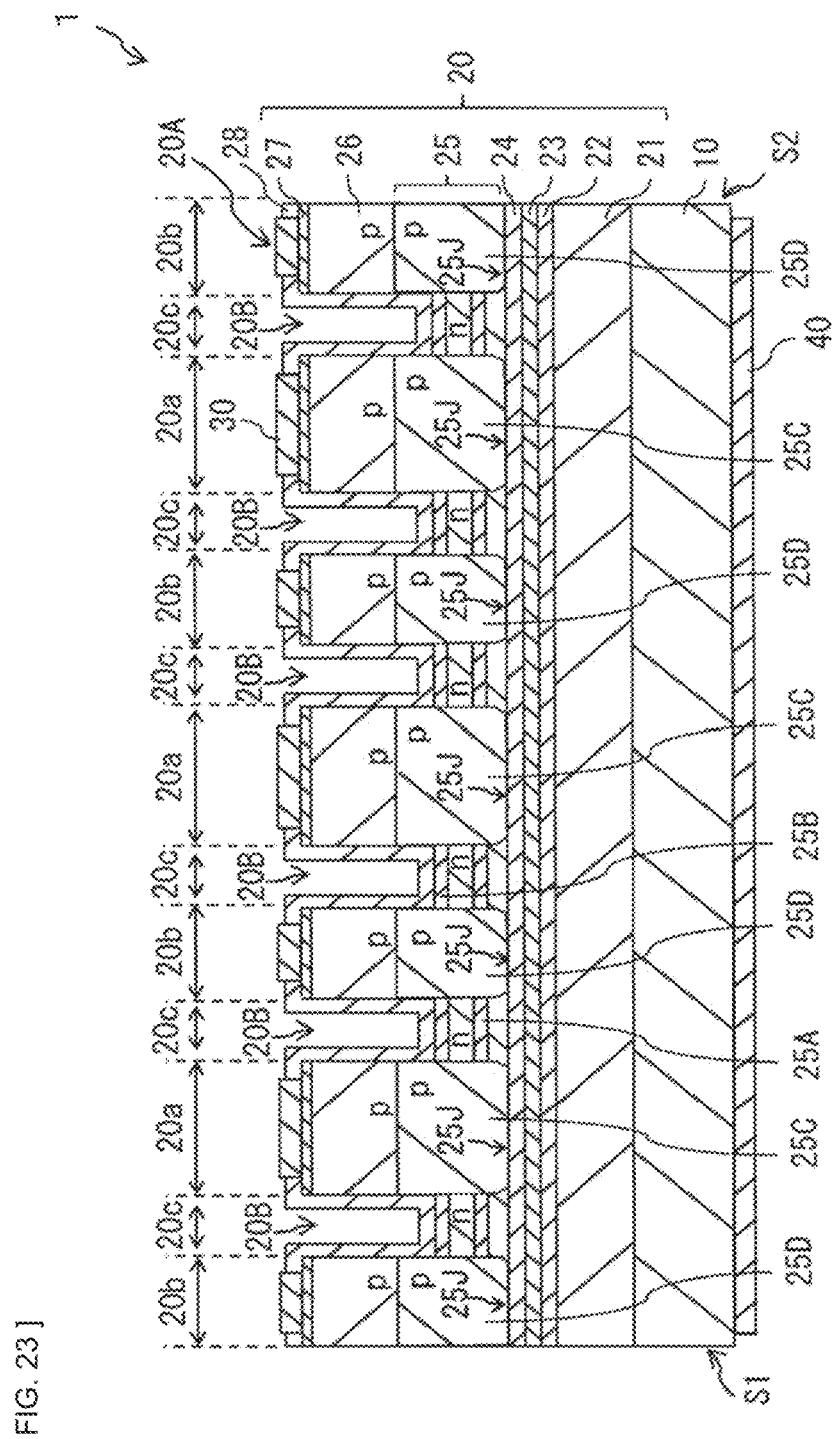
[FIG. 23]

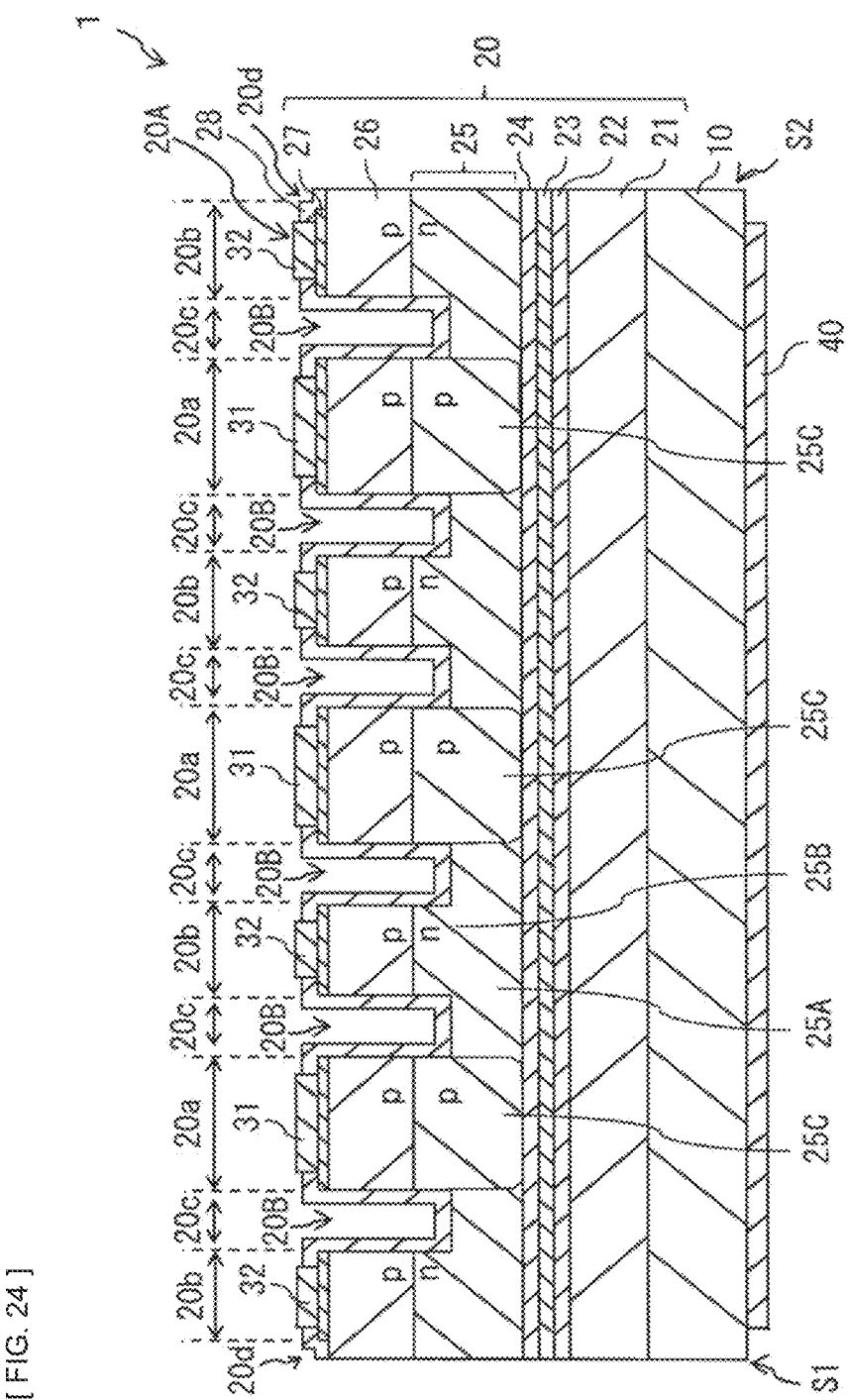
[FIG. 24]

[FIG. 25]
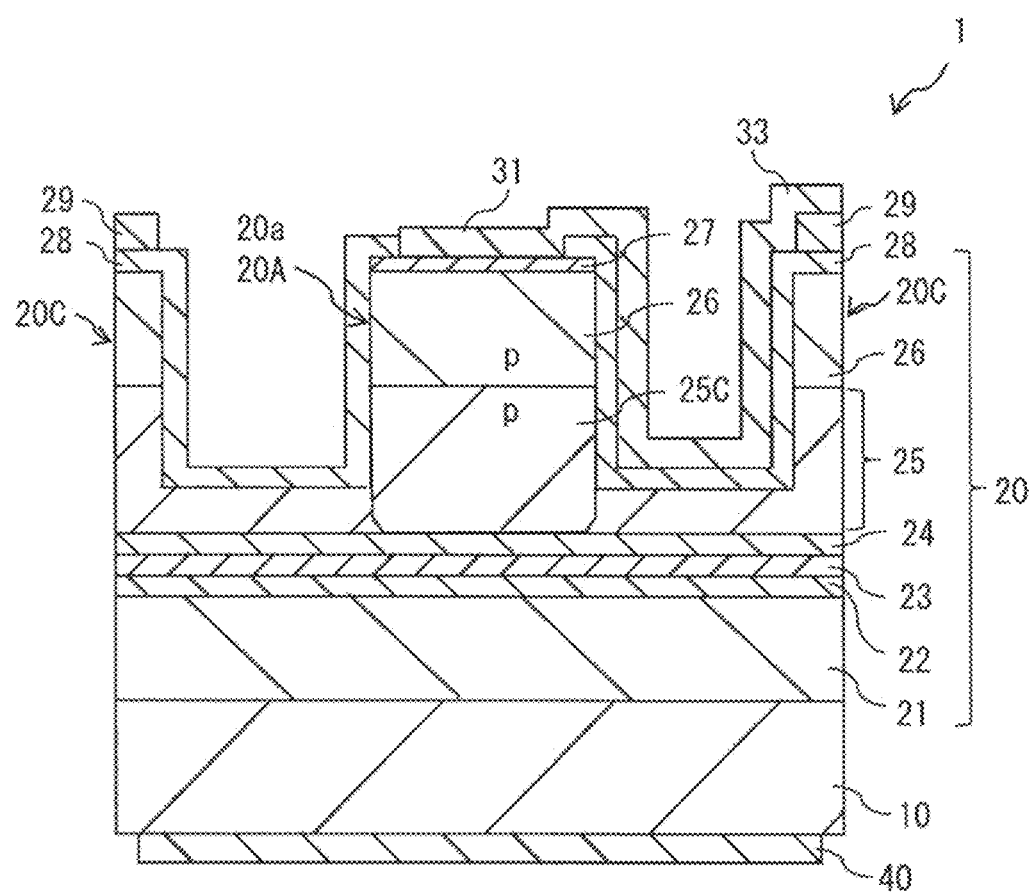

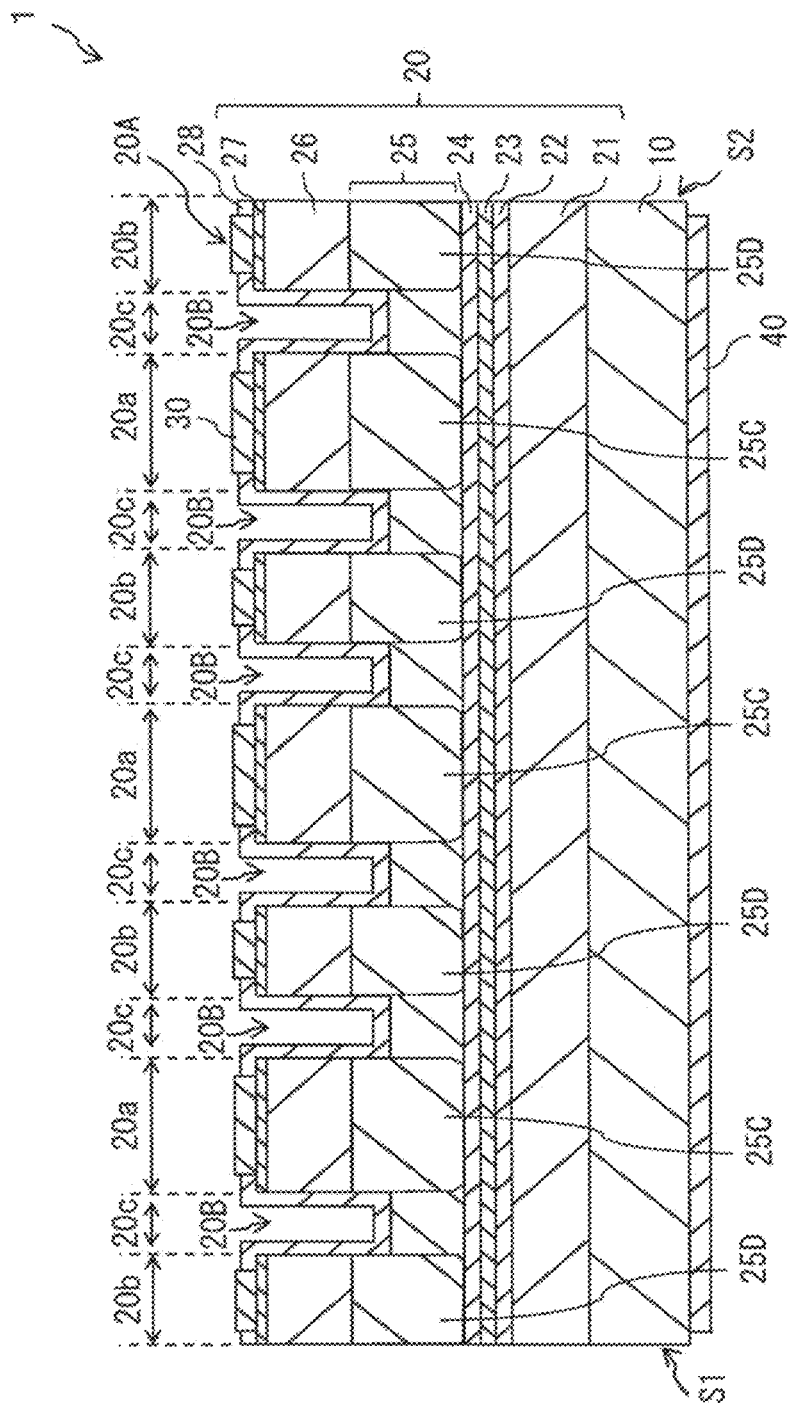
[FIG. 26]

[FIG. 27]
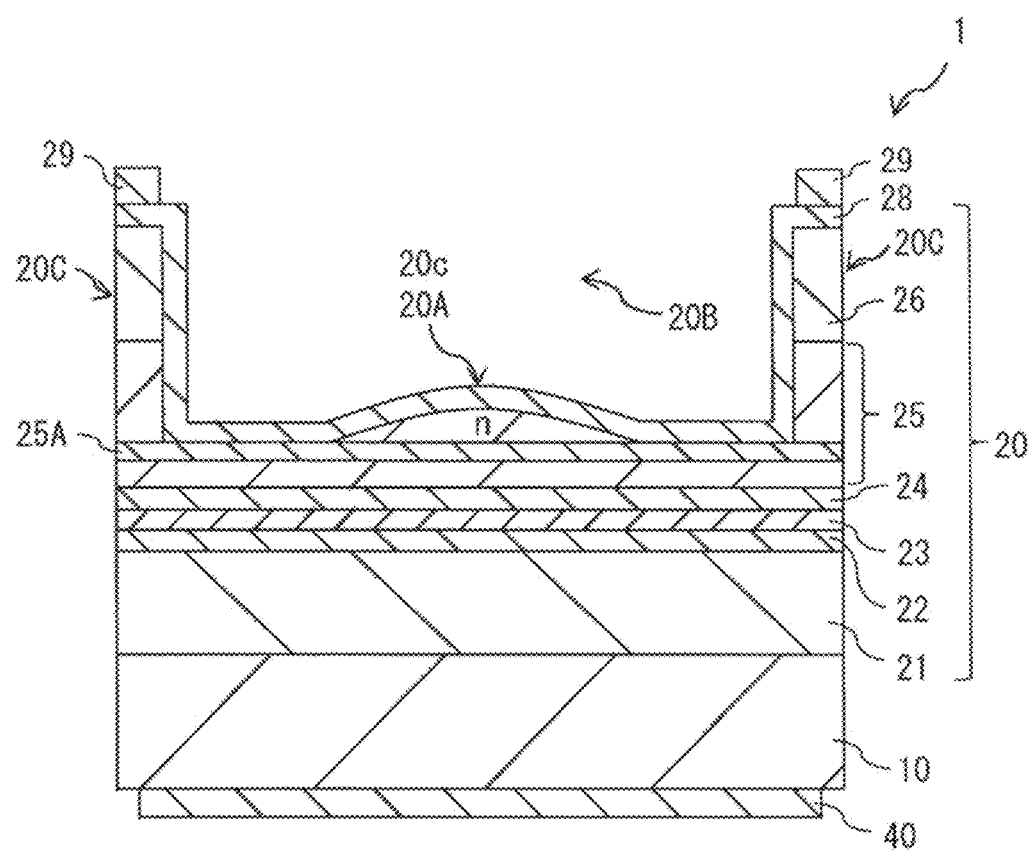

[FIG. 28]
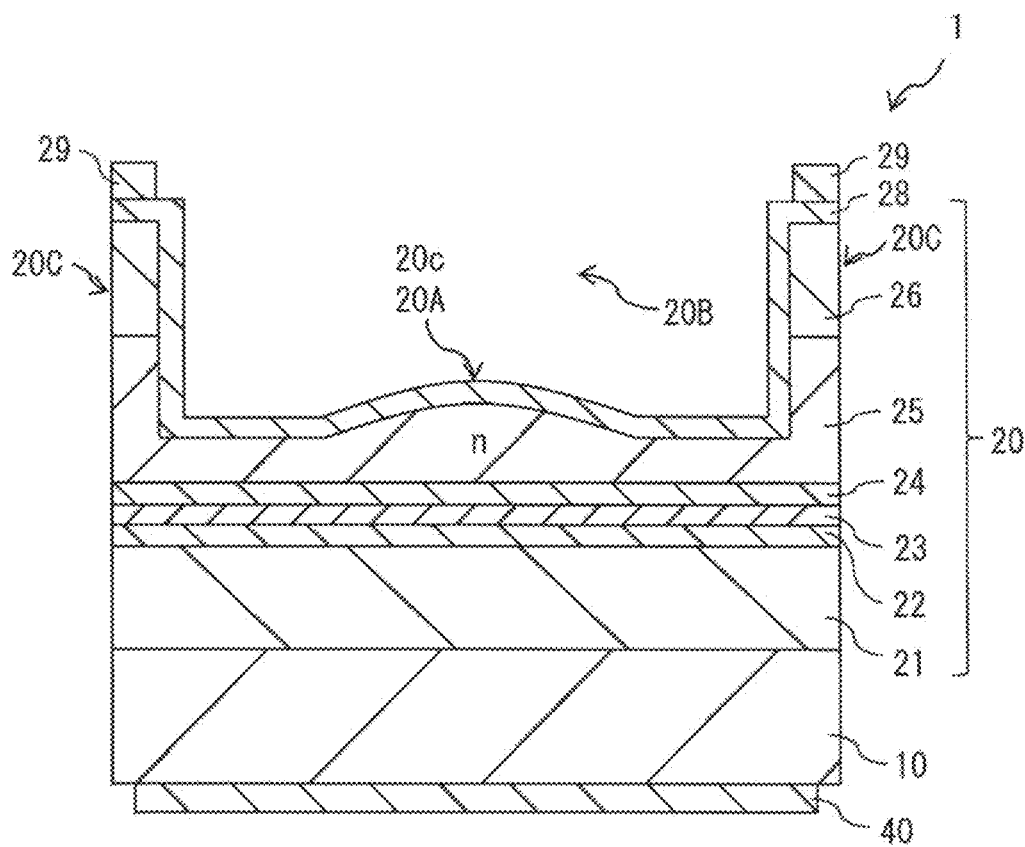
[FIG. 29]
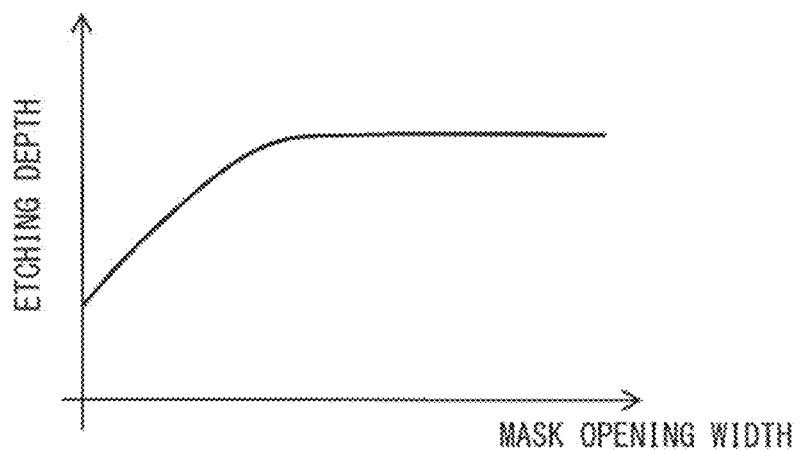

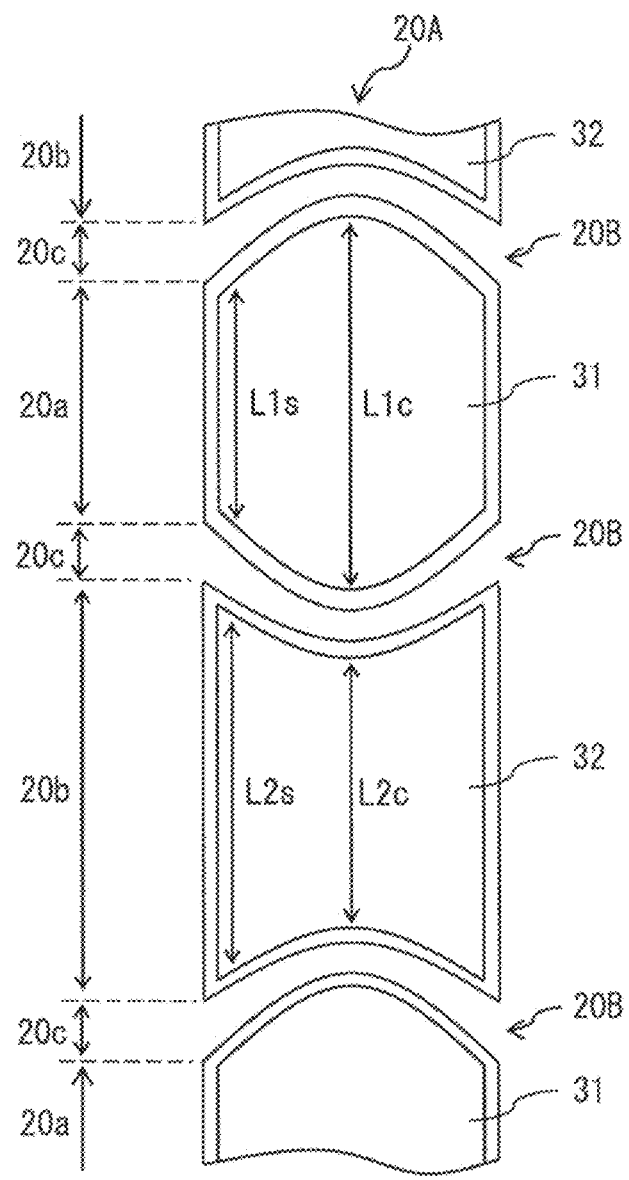
[FIG. 30]

[FIG. 31]
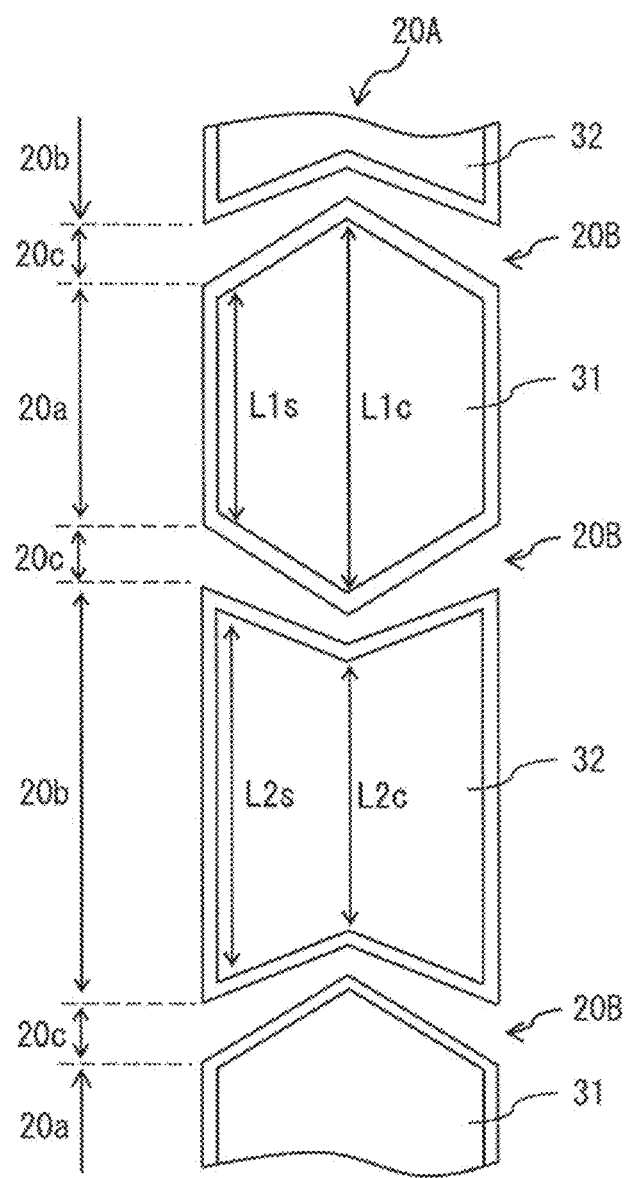

[FIG. 32]
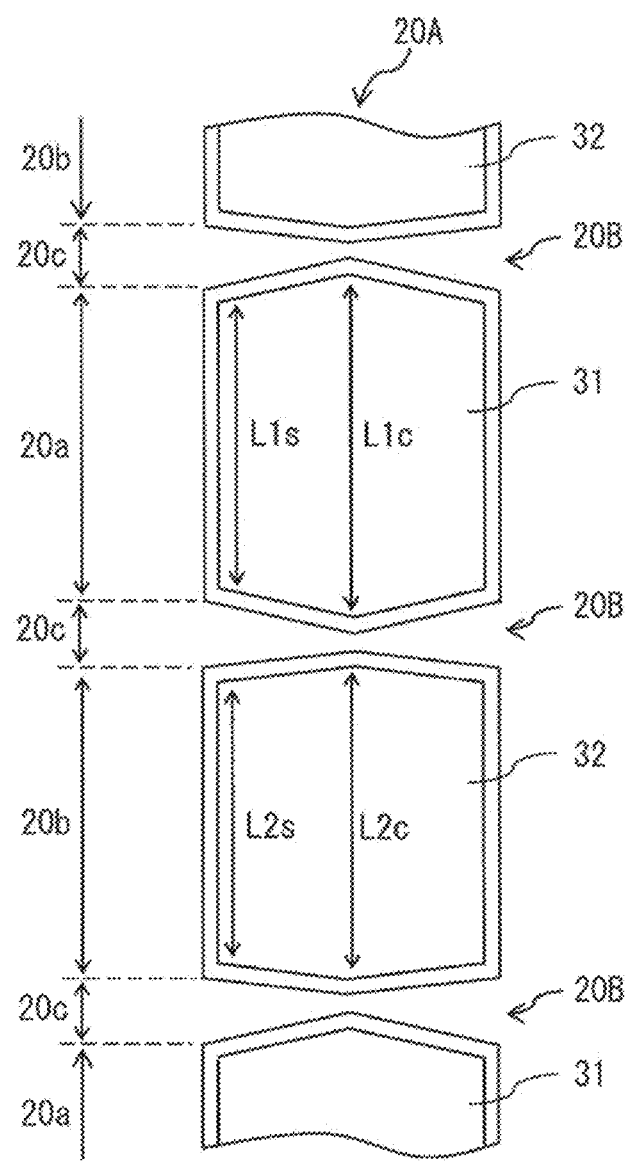

[ FIG. 33 ]
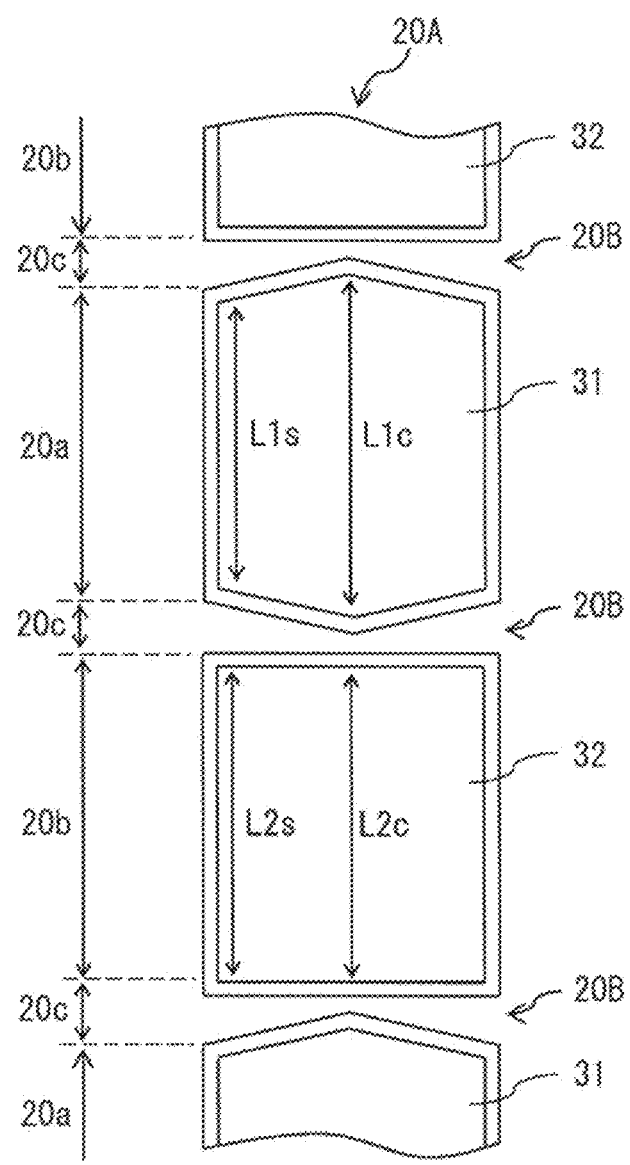

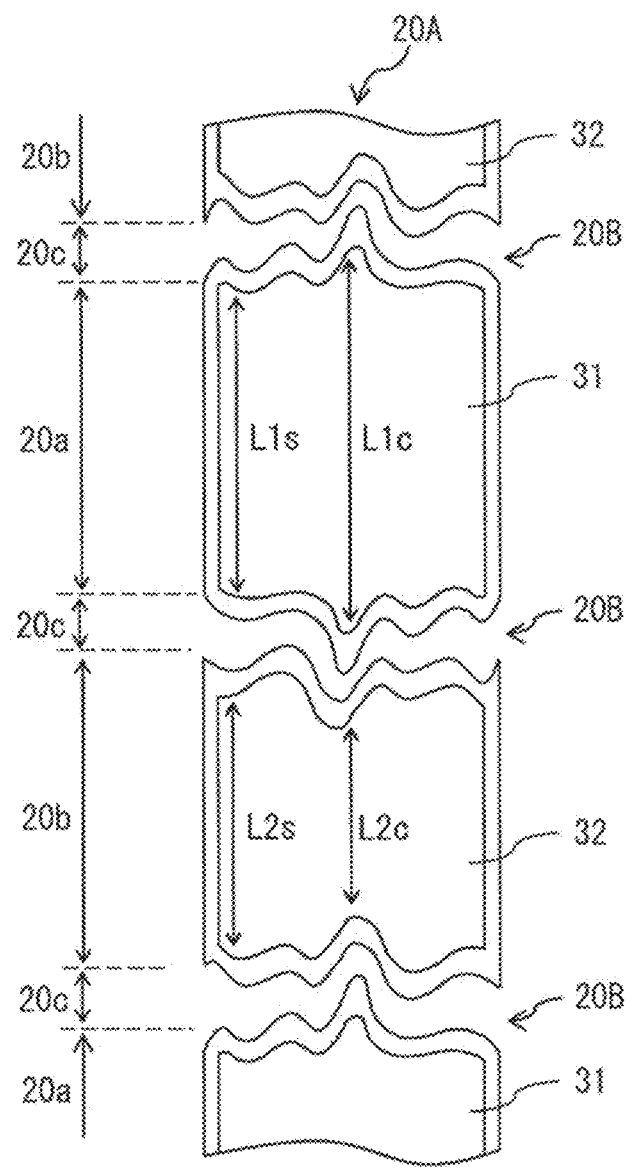
[FIG. 34]

[ FIG. 35 ]
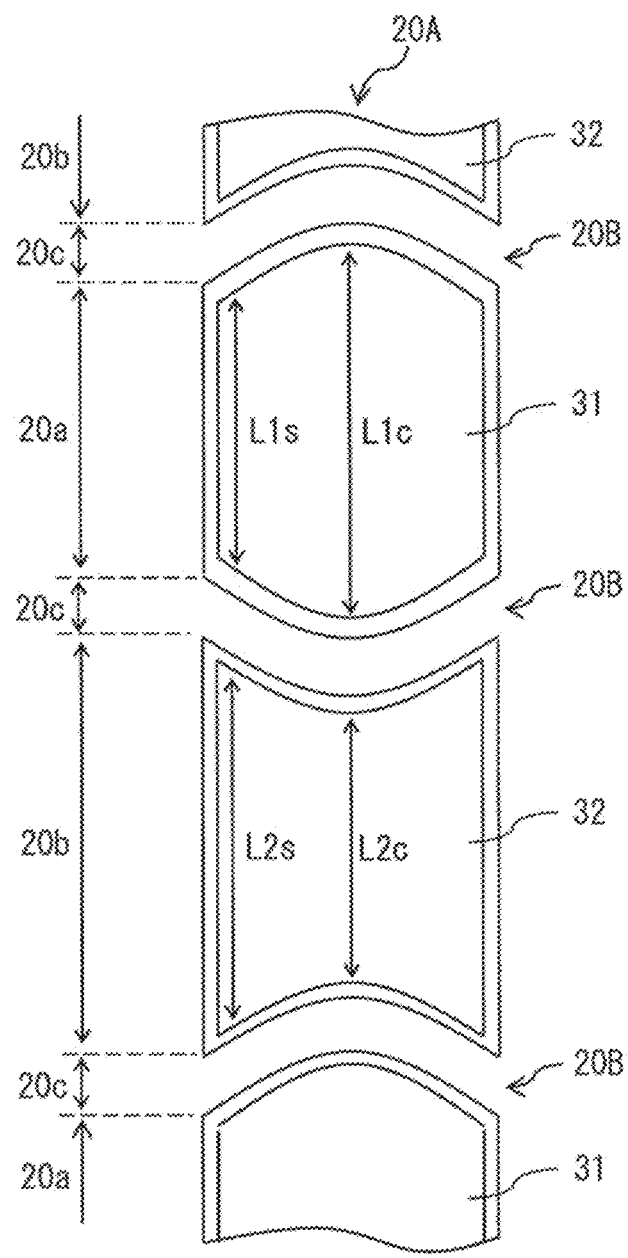

[ FIG. 36 ]
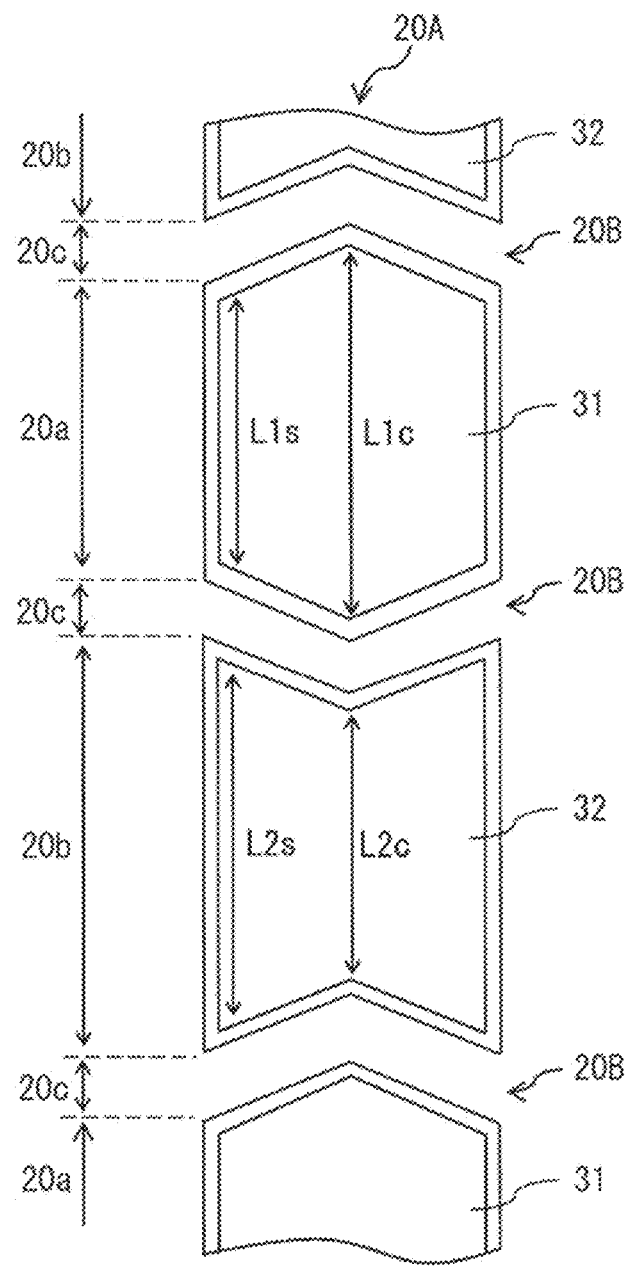

[FIG. 37]
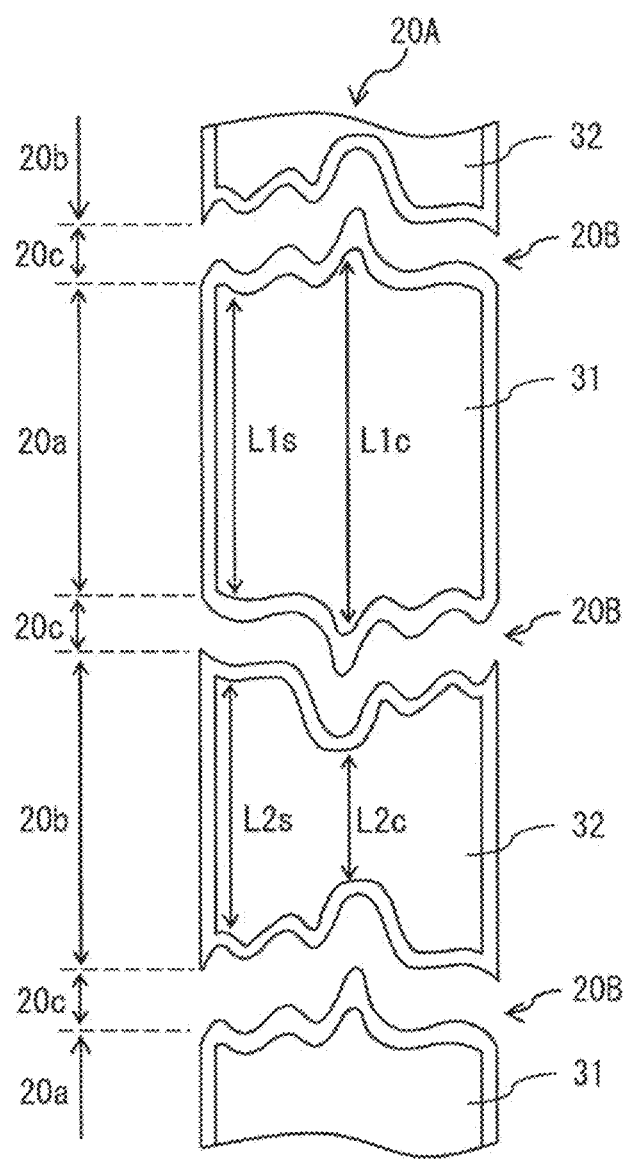

[FIG. 38]
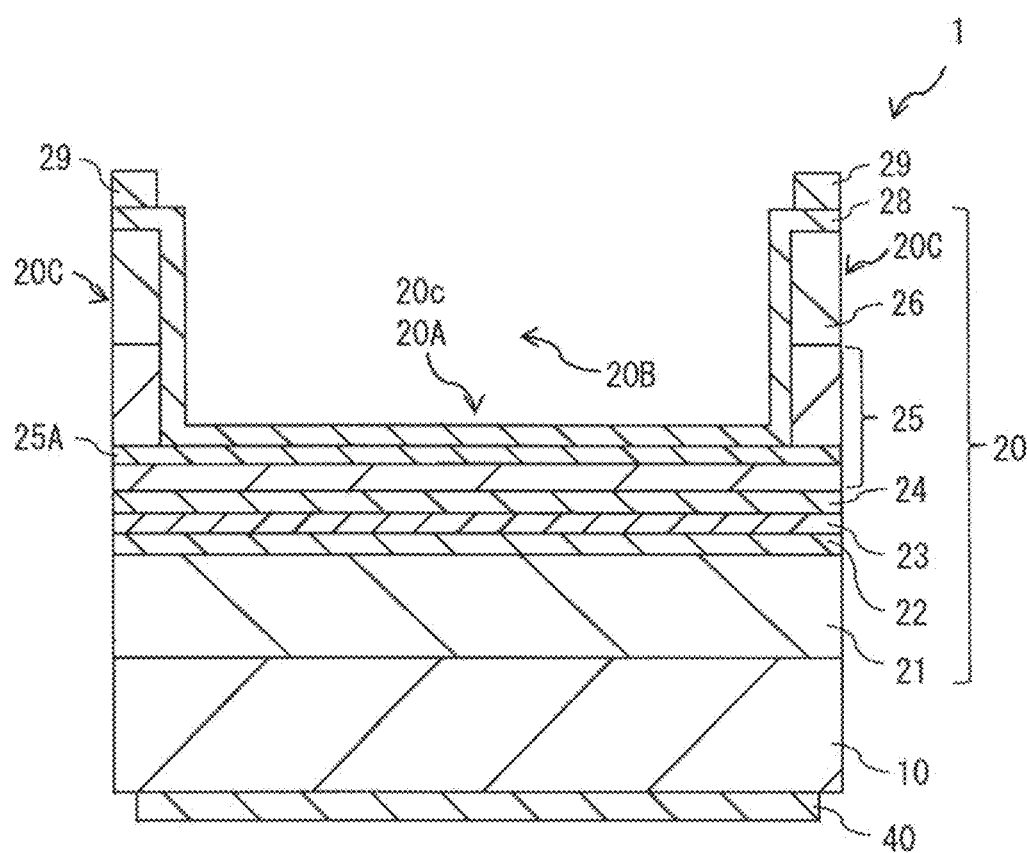

[FIG. 39]
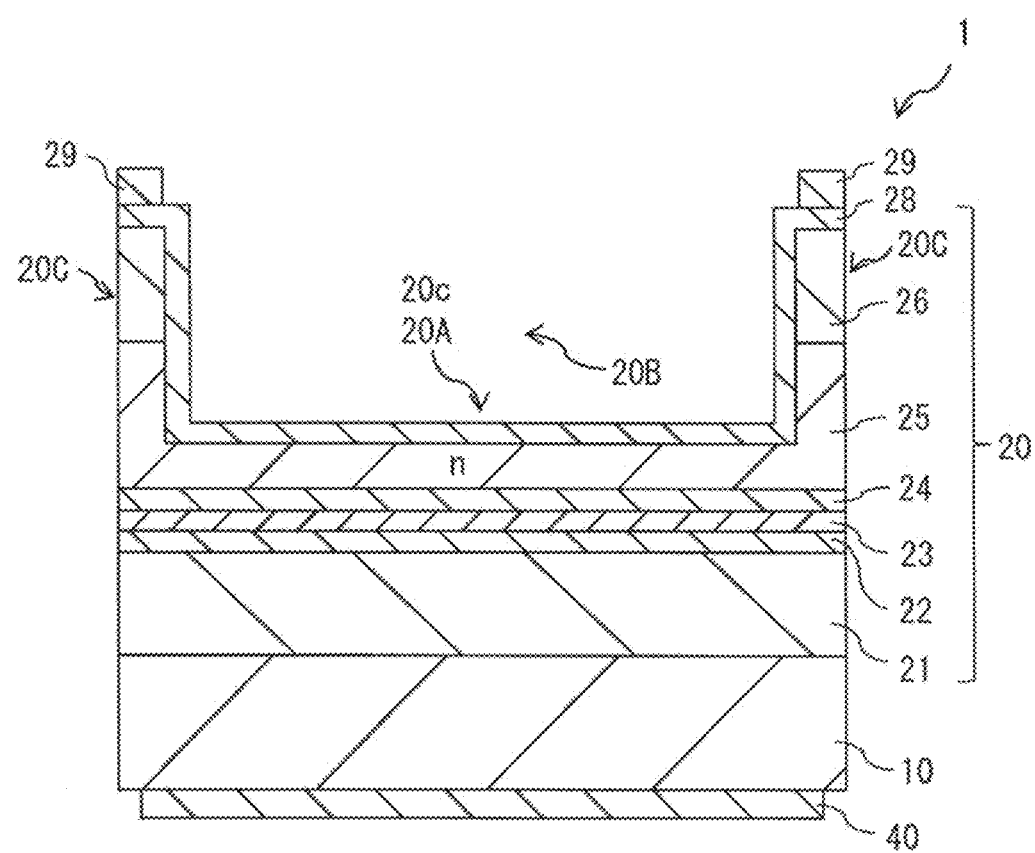

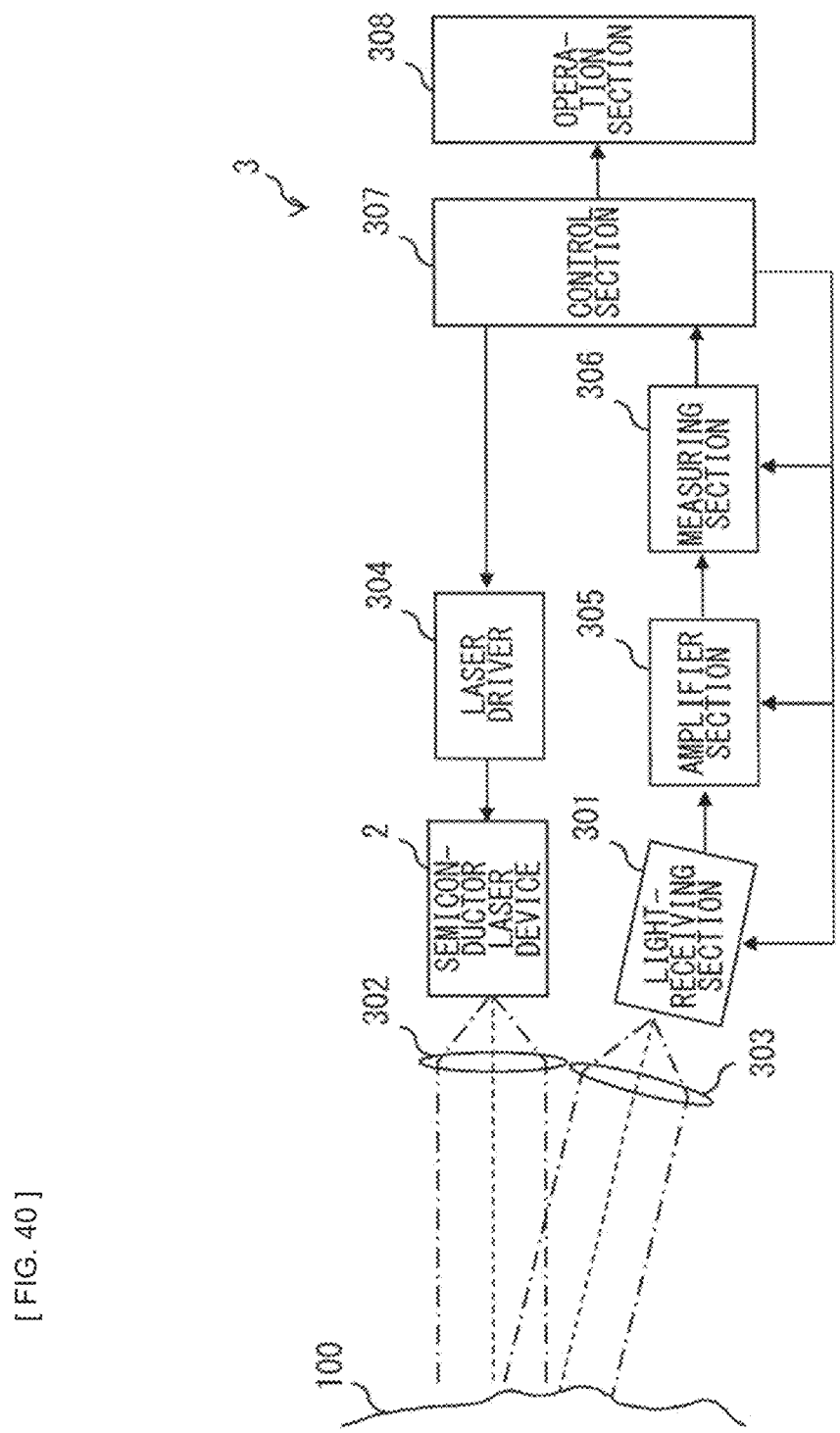
[FIG. 40]

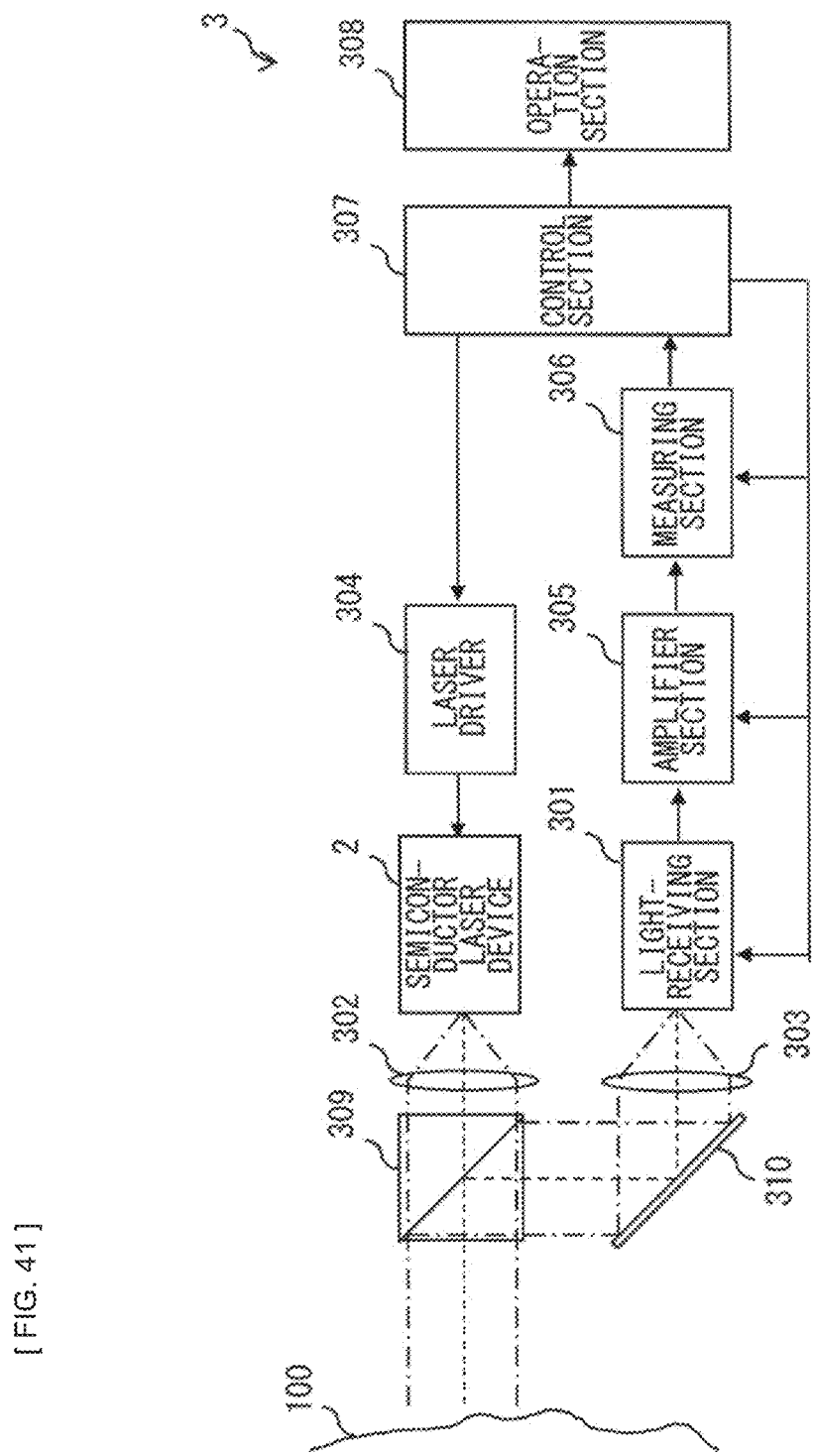
[FIG. 41]

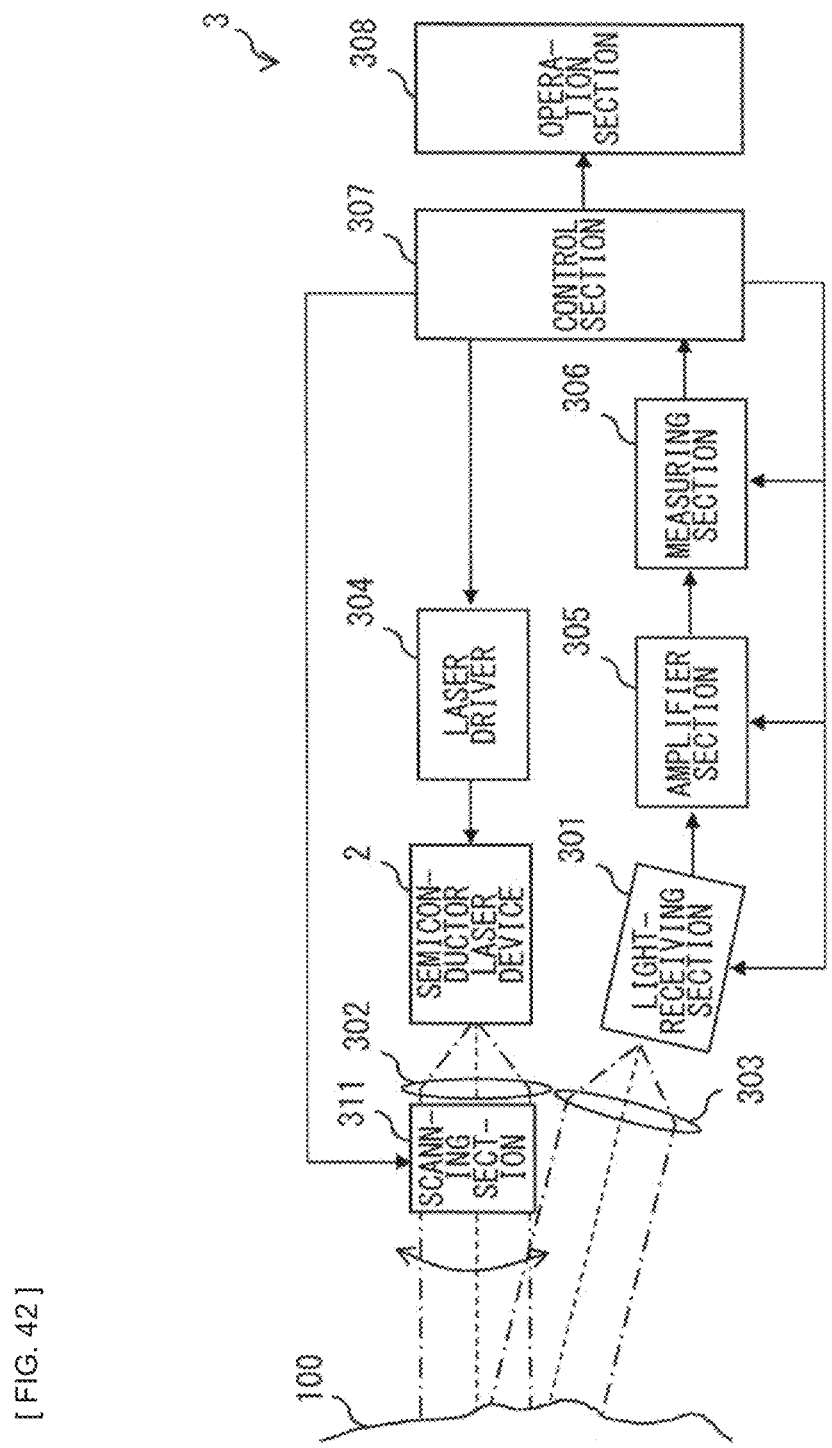
[FIG. 42]

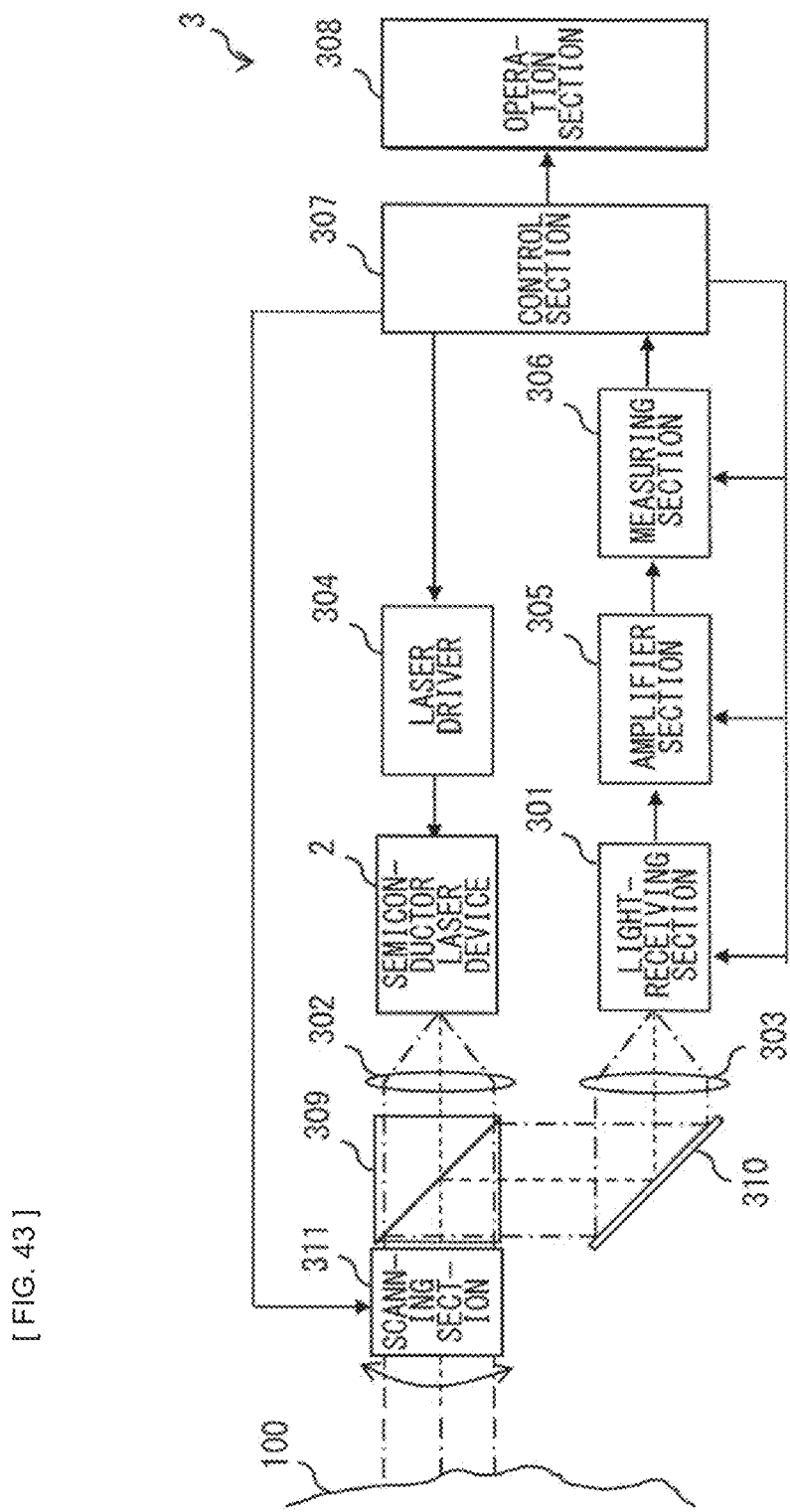
[ FIG. 43 ]

SEMICONDUCTOR LASER, ELECTRONIC APPARATUS, AND METHOD OF DRIVING SEMICONDUCTOR LASER

CROSS REFERENCE TO RELATED APPLICATIONS

This application is a U.S. National Phase of International Patent Application No. PCT/JP2017/025342 filed on Jul. 12, 2017, which claims priority benefit of Japanese Patent Application No. JP 2016-164934 filed in the Japan Patent Office on Aug. 25, 2016. Each of the above-referenced applications is hereby incorporated herein by reference in its entirety.

TECHNICAL FIELD

The present disclosure relates to a semiconductor laser, an electronic apparatus, and a method of driving the semiconductor laser.

BACKGROUND ART

In a semiconductor laser, there is a Q-switch operation as a method of obtaining a high-power pulse by controlling oscillation. In the Q-switch operation, optical loss is initially increased to suppress oscillation, thereby facilitating optical pumping to cause the number of atoms in excited states to sufficiently increase; at that point in time, a Q-value is raised, thus allowing for oscillation. The semiconductor laser that allows for the Q-switch operation is described in the following PTLs 1 to 5, for example.

CITATION LIST

Patent Literature

PTL 1: Japanese Unexamined Patent Application Publication No. H1-262683
PTL 2: Japanese Unexamined Patent Application Publication No. H5-90700
PTL 3: Japanese Unexamined Patent Application Publication No. H10-229252
PTL 4: Japanese Unexamined Patent Application Publication No. 2005-39099
PTL 5: Japanese Unexamined Patent Application Publication No. 2008-258274

SUMMARY OF THE INVENTION

In a semiconductor laser that allows for a Q-switch operation, a current leakage may occur in some cases between a gain region and a Q-switch region. The current leakage that occurs between the gain region and the Q-switch region causes an adverse effect on the Q-switch operation. It is therefore desirable to provide a semiconductor laser, an electronic apparatus, and a method of driving the semiconductor laser that make it possible to suppress a current leakage.

A semiconductor laser according to an embodiment of the present disclosure includes, on a semiconductor substrate, a first semiconductor layer of a first conductivity type, an active layer, a second semiconductor layer of the first conductivity type, and a third semiconductor layer of a second conductivity type, in this order. The semiconductor laser further includes a ridge part formed in the second semiconductor layer and the third semiconductor layer, and extending in a stacked in-plane direction. The ridge part has a structure in which a plurality of gain regions and a plurality of Q-switch regions are each disposed alternately with each of separation regions being interposed therebetween in an extending direction of the ridge part. The separation regions each have a separation groove that separates from each other, by a space, the gain region and the Q-switch region adjacent to each other. The separation groove has a bottom surface at a position, in the second semiconductor layer, higher than a part corresponding to a foot of each of both sides of the ridge part.

An electronic apparatus according to an embodiment of the present disclosure includes the semiconductor laser as a light source.

A method of driving a semiconductor laser according to an embodiment of the present disclosure is a method of driving the semiconductor laser including: applying a forward bias pulse voltage to a gain region; and applying a reverse bias to a Q-switch region.

In the semiconductor laser, the electronic apparatus, the method of driving the semiconductor laser according to the respective embodiments of the present disclosure, the bottom surface of the separation groove in the ridge part is provided at a position, in the second semiconductor layer of the first conductivity type, higher than the part corresponding to the foot of each of both the sides of the ridge part. Accordingly, a depletion region formed between the gain region and the Q-switch region causes a part between the gain region and the Q-switch region to have a higher resistance. Moreover, light scattering of carriers in the gain region is suppressed to increase injection carrier density.

According to the semiconductor laser, the electronic apparatus, the method of driving the semiconductor laser of the respective embodiments of the present disclosure, the depletion region formed between the gain region and the Q-switch region causes the part between the gain region and the Q-switch region to have a higher resistance, and the light scattering of carriers in the gain region is suppressed to increase the injection carrier density. Thus, it becomes possible to suppress a current leakage. It is to be noted that the effects of the present disclosure are not necessarily limited to those described here, and may be any of the effects described in the present specification.

BRIEF DESCRIPTION OF DRAWINGS

FIG. 1 illustrates a configuration example of a top surface of a semiconductor laser according to a first embodiment of the present disclosure.

FIG. 2 illustrates a perspective configuration example of the semiconductor laser illustrated in FIG. 1.

FIG. 3 illustrates a perspective configuration example of a portion of the semiconductor laser illustrated in FIG. 2 excluding bank parts.

FIG. 4 illustrates a cross-sectional configuration example of the semiconductor laser illustrated in FIG. 1 taken along a line A-A.

FIG. 5 illustrates a cross-sectional configuration example of the semiconductor laser illustrated in FIG. 1 taken along a line B-B.

FIG. 6 illustrates a cross-sectional configuration example of the semiconductor laser illustrated in FIG. 1 taken along a line C-C.

FIG. 7 illustrates a cross-sectional configuration example of the semiconductor laser illustrated in FIG. 1 taken along a line D-D.

FIG. 8 illustrates a perspective configuration example of a semiconductor laser device mounted with the semiconductor laser illustrated in FIG. 1 on a sub-mount.

FIG. 9 illustrates a cross-sectional configuration example of a wafer in a manufacturing process of the semiconductor laser illustrated in FIG. 1.

FIG. 10 illustrates a cross-sectional configuration example of the wafer in a manufacturing process subsequent to FIG. 9.

FIG. 11 illustrates a cross-sectional configuration example of the wafer in a manufacturing process subsequent to FIG. 10.

FIG. 12A illustrates a cross-sectional configuration example of the wafer in a manufacturing process subsequent to FIG. 11.

FIG. 12B illustrates a cross-sectional configuration example of the wafer in a manufacturing process subsequent to FIG. 11.

FIG. 12C illustrates a cross-sectional configuration example of the wafer in a manufacturing process subsequent to FIG. 11.

FIG. 13 illustrates a cross-sectional configuration example of the wafer in a manufacturing process subsequent to FIG. 12A.

FIG. 14 illustrates an example of a depletion region generated in the semiconductor laser illustrated in FIG. 1.

FIG. 15 illustrates an example of waveforms of voltages to be applied to the semiconductor laser illustrated in FIG. 1.

FIG. 16 illustrates an example of waveforms of voltages to be applied to the semiconductor laser illustrated in FIG. 1.

FIG. 17 illustrates an example of changes in optical outputs over time.

FIG. 18 illustrates an example of a change in a carrier density of each gain region over time.

FIG. 19 illustrates an example of a change in a carrier density of each gain region over time.

FIG. 20 illustrates an example of a change in a carrier density of each gain region over time.

FIG. 21 illustrates a modification example of the perspective configuration of the semiconductor laser illustrated in FIG. 1.

FIG. 22 illustrates a modification example of the cross-sectional configuration of the semiconductor laser illustrated in FIG. 1 taken along the line B-B.

FIG. 23 illustrates a modification example of the cross-sectional configuration of the semiconductor laser illustrated in FIG. 1 taken along the line A-A.

FIG. 24 illustrates a modification example of the cross-sectional configuration of the semiconductor laser illustrated in FIG. 1 taken along the line A-A.

FIG. 25 illustrates a modification example of the cross-sectional configuration of the semiconductor laser illustrated in FIG. 1 taken along the line B-B.

FIG. 26 illustrates a modification example of the cross-sectional configuration of the semiconductor laser illustrated in FIG. 1 taken along the line A-A.

FIG. 27 illustrates a modification example of the cross-sectional configuration of the semiconductor laser illustrated in FIG. 1 taken along the line D-D.

FIG. 28 illustrates a modification example of the cross-sectional configuration of the semiconductor laser illustrated in FIG. 1 taken along the line D-D.

FIG. 29 is an explanatory diagram of a micro-loading effect.

FIG. 30 illustrates a modification example of a top surface configuration of a portion of a ridge part illustrated in FIG. 1.

FIG. 31 illustrates a modification example of the top surface configuration of a portion of the ridge part illustrated in FIG. 1.

FIG. 32 illustrates a modification example of the top surface configuration of a portion of the ridge part illustrated in FIG. 1.

FIG. 33 illustrates a modification example of the top surface configuration of a portion of the ridge part illustrated in FIG. 1.

FIG. 34 illustrates a modification example of the top surface configuration of a portion of the ridge part illustrated in FIG. 1.

FIG. 35 illustrates a modification example of the top surface configuration of a portion of the ridge part illustrated in FIG. 1.

FIG. 36 illustrates a modification example of the top surface configuration of a portion of the ridge part illustrated in FIG. 1.

FIG. 37 illustrates a modification example of the top surface configuration of a portion of the ridge part illustrated in FIG. 1.

FIG. 38 illustrates a modification example of the cross-sectional configuration of the semiconductor laser illustrated in FIG. 1 taken along the line D-D.

FIG. 39 illustrates a modification example of the cross-sectional configuration of the semiconductor laser illustrated in FIG. 1 taken along the line D-D.

FIG. 40 illustrates a schematic configuration example of a distance measuring unit according to a second embodiment of the present disclosure.

FIG. 41 illustrates a modification example of the schematic configuration of the distance measuring unit illustrated in FIG. 40.

FIG. 42 illustrates a modification example of the schematic configuration of the distance measuring unit illustrated in FIG. 40.

FIG. 43 illustrates a modification example of the schematic configuration of the distance measuring unit illustrated in FIG. 40.

MODES FOR CARRYING OUT THE INVENTION

In the following, embodiments for carrying out the present disclosure are described in detail with reference to drawings. The following description is directed to specific examples of the present disclosure, and the present disclosure is not limited to the following embodiments. Moreover, the present disclosure is not limited to positions, dimensions, dimension ratios, and other factors of respective components illustrated in the drawings. It is to be noted that the description is given in the following order.

1. First Embodiment (Semiconductor Laser)

An example in which only a gain region is provided with an impurity diffusion region 2. Modification Examples of First Embodiment (Semiconductor Laser)

Modification Example A: an example in which there is no protrusion of a separation region in a width-direction Modification Example B: an example in which an impurity diffusion region is formed only in a ridge part Modification Example C: an example in which a Q-switch region is also provided with an impurity diffusion region Modification Example D: an example in which an etching stop layer is omitted Modification Example E: an example in which a bottom of a separation groove has a convex shape Modification Example F: an example in which a separation groove has a width that is narrow in the middle of a ridge Modification Example G: an example in which a convex shape is provided on an end surface in a gain region
   an example in which a concave shape is provided on an end surface in a Q-switch region Modification Example H: an example in which a convex shape, a concave shape, or a concavo-convex shape is provided on an end surface Modification Example I: an example in which a bottom of a separation groove is of the same height as a foot of a side of a ridge 3. Second Embodiment (Distance Measuring Unit)

An example in which a semiconductor laser according to any of the foregoing embodiment and modification examples thereof is used as a light source of a distance measuring unit 1. First Embodiment

[Configuration]

Description is given of a configuration of a semiconductor laser 1 according to a first embodiment of the present disclosure. FIG. 1 illustrates a configuration example of a top surface of the semiconductor laser 1 according to the present embodiment. FIG. 2 illustrates a perspective configuration example of the semiconductor laser 1 illustrated in FIG. 1. FIG. 3 illustrates a perspective configuration example of a portion of the semiconductor laser 1 illustrated in FIG. 1 excluding bank parts 20C (described later).

The semiconductor laser 1 is an element that generates an optical pulse, and is used suitably, for example, as a light source of a laser radar, a laser for processing, a medical laser scalpel, and the like. The semiconductor laser 1 is an edge-emitting laser. The semiconductor laser 1 includes a front end surface S1 and a rear end surface S2 that are opposed to each other in a resonator-direction, and a raised ridge part 20A interposed between the front end surface S1 and the rear end surface S2. The semiconductor laser 1 has a length of 1,000 µm, for example, in the resonator-direction. The length of the semiconductor laser 1 in the resonator-direction is appropriately adjustable depending on necessary characteristics. The ridge part 20A extends in the resonator-direction. One end surface of the ridge part 20A is exposed to the front end surface S1, for example, and the other end surface of the ridge part 20A is exposed to the rear end surface S2, for example. It is to be noted that the respective end surfaces of the ridge part 20A may be provided at positions recessed slightly from the front end surface S1 and the rear end surface S2. In this case, it follows that the respective end surfaces of the ridge part 20A are not provided in the same plane as the front end surface S1 and the rear end surface S2. At this occasion, a current non-injection region 20d described later may not be necessarily provided.

The front end surface S1 and the rear end surface S2 are each a surface formed by cleavage. The front end surface S1 and the rear end surface S2 each serve as a resonator mirror, and the ridge part 20A serves as an optical waveguide. The front end surface S1 is provided with an anti-reflection film, for example. The anti-reflection film includes, for example, a dielectric (e.g., $SiO_2$, $TiO_2$, $Ta_2O_5$, SiN, etc.), and is configured to have a reflectance of about 15% at the front end surface S1. The rear end surface S2 is provided with a multilayer reflection film, for example. The multilayer reflection film includes, for example, a dielectric (e.g., $SiO_2$, $TiO_2$, $Ta_2O_5$, SiN, etc.) and Si, and is configured to have a reflectance of about 85% at the rear end surface S2.

The semiconductor laser 1 includes the bank parts 20C in a raised shape at respective sides of the ridge part 20A. In other words, the semiconductor laser 1 has a double-ridge structure configured by the ridge part 20A and the two bank parts 20C. The bank parts 20C are each provided for the purpose of protecting the ridge part 20A and of securing a region for wire-bonding. The bank parts 20C each extend, for example, in a direction parallel to the extending direction of the ridge part 20A. Each of the bank parts 20C may be omitted as necessary. The semiconductor laser 1 is a multi-electrode semiconductor laser provided with a multiplicity of electrodes on the ridge part 20A.

The ridge part 20A is configured by a plurality of gain regions 20a, a plurality of Q-switch regions 20b, and a plurality of separation regions 20c, for example. The plurality of gain regions 20a and the plurality of Q-switch regions 20b are each disposed alternately with the separation region 20c being interposed therebetween in the extending direction of the ridge part 20A. In other words, the ridge part 20A has a structure in which the plurality of gain regions 20a and the plurality of Q-switch regions 20b are each disposed alternately with the separation region 20c being interposed therebetween in the extending direction of the ridge part 20A. Each of the separation regions 20c is disposed between the gain region 20a and the Q-switch region 20b. Each of the separation regions 20c is configured by a separation groove 20B in a recessed shape provided in the ridge part 20A and by a part, of the ridge part 20A, immediately below the separation groove 20B. It is preferable that the gain regions 20a each have a length of 500 µm or less, desirably 300 µm or less. When the gain regions 20a each have a length more than 500 µm, carrier density is less likely to be increased, and thus it becomes highly possible that an optical output may be lowered. Meanwhile, when the gain regions 20a each have a length of 300 µm or less, particularly the carrier density is more likely to be increased, thus making it easier to enhance the optical output.

Either the Q-switch region 20b or the gain region 20a may be provided at an end of the ridge part 20A on side of the front end surface S1. Further, either the Q-switch region 20b or the gain region 20a may be provided at an end of the ridge part 20A on side of the rear end surface S2. Moreover, the current non-injection region 20d may be provided at both the ends of the ridge part 20A. The current non-injection region 20d is a region that suppresses unstable oscillation caused by a current flowing in a vicinity of the front end surface S1 or the rear end surface S2. The current non-injection region 20d is a region where no contact layer 27 described later is provided, and is a region where no current is injected directly from an electrode.

FIG. 4 illustrates a cross-sectional configuration example of the semiconductor laser 1 illustrated in FIG. 1 taken along a line A-A. FIG. 5 illustrates a cross-sectional configuration example of the semiconductor laser 1 illustrated in FIG. 1 taken along a line B-B. FIG. 6 illustrates a cross-sectional configuration example of the semiconductor laser 1 illustrated in FIG. 1 taken along a line C-C. FIG. 7 illustrates a cross-sectional configuration example of the semiconductor laser 1 illustrated in FIG. 1 taken along a line D-D. FIG. 8 illustrates a perspective configuration example of a semiconductor laser device 2 mounted with the semiconductor laser 1 illustrated in FIG. 1 on a sub-mount 201 (described later).

The semiconductor laser 1 includes a substrate 10 and a semiconductor layer 20 formed on the substrate 10. The semiconductor layer 20 includes, for example, a lower cladding layer 21, a lower guide layer 22, an active layer 23, an upper guide layer 24, a first upper cladding layer 25, a second upper cladding layer 26, and a contact layer 27 in this order, from side of the substrate 10. The semiconductor layer 20 may include a layer other than those described above. The semiconductor layer 20 may include a buffer layer at a position between the lower cladding layer 21 and the substrate 10, for example.

The substrate 10 is, for example, a Si-doped n-type GaAs substrate. The lower cladding layer 21 includes, for example, Si-doped n-type $Al_{x1}Ga_{1-x1}As$ (0.2<x1<0.5). The lower guide layer 22 includes, for example, Si-doped n-type $Al_{x2}Ga_{1-x2}As$ (0.1<x2<0.3). The buffer layer includes, for example, Si-doped n-type $Al_{0.3}Ga_{0.7}As$. A concentration of Si included in the substrate 10, the lower cladding layer 21, the lower guide layer 22, and the buffer is about $5\times10^{17}$ $cm^{-3}$, for example.

The active layer 23 has a multiple quantum well structure, for example. The multiple quantum well structure is, for example, a structure in which a barrier layer and a well layer are stacked alternately. The barrier layer includes, for example, $Al_{0.1}Ga_{0.9}As$. The well layer includes, for example, $Al_{0.4}Ga_{0.6}As$. In the active layer 23, a dopant and a doping concentration in the multiple quantum well structure that configures the active layer 23 are adjusted to allow an average electric property of the active layer 23 to be of n-type.

The upper guide layer 24 includes, for example, Si-doped n-type $Al_{0.3}Ga_{0.7}As$. The first upper cladding layer 25 includes, for example, Si-doped n-type $Al_{0.5}Ga_{0.5}As$. The first upper cladding layer 25 includes, for example, etching stop layers 25A and 25B that are disposed apart from each other. The etching stop layers 25A and 25B are each a semiconductor layer having a composition ratio different from a composition ratio of another part of the first upper cladding layer 25. The etching stop layer 25A is disposed closer to the substrate 10 than the etching stop layer 25B to the substrate 10, and includes, for example, Si-doped n-type $Al_{0.3}Ga_{0.7}As$. The etching stop layer 25B is disposed more distant from the substrate 10 than the etching stop layer 25A from the substrate 10, and includes, for example, Si-doped n-type $Al_{0.3}Ga_{0.7}As$. A layer, of the first upper cladding layer 25, interposed between the etching stop layer 25A and the etching stop layer 25B has a thickness t2 that is a thickness equal to t1±50 nm, for example, provided that t1 denotes a thickness of the contact layer 27. The thickness t2 is a thickness equal to or more than 100 nm, for example.

The second upper cladding layer 26 includes, for example, C-doped p-type $Al_{0.5}Ga_{0.5}As$. The contact layer 27 includes, for example, C-doped p-type GaAs. The second upper cladding layer 26 and the contact layer 27 each have a conductivity type that is different from a conductivity type of each of the substrate 10, the buffer layer, the lower cladding layer 21, the lower guide layer 22, the active layer 23, the upper guide layer 24, and the first upper cladding layer 25. Specifically, the second upper cladding layer 26 and the contact layer 27 each have p-conductivity type, whereas the substrate 10, the buffer layer, the lower cladding layer 21, the lower guide layer 22, the active layer 23, the upper guide layer 24, and the first upper cladding layer 25 each have n-conductivity type. Accordingly, an interface between the first upper cladding layer 25 and the second upper cladding layer 26 serves as a p-n junction 25J.

The semiconductor laser 1 includes an impurity diffusion region 25C at a location, of the first upper cladding layer 25, corresponding to the gain region 20a and regions at both sides thereof. The impurity diffusion region 25C is in contact with the second upper cladding layer 26 in the gain region 20a. The impurity diffusion region 25C has the same conductivity type as that of the second upper cladding layer 26. The impurity diffusion region 25C is, for example, a region formed by diffusing Zn to the first upper cladding layer 25. A lower end of the impurity diffusion region 25C either may be positioned at an interface between the first upper cladding layer 25 and the upper guide layer 24, or may be positioned in the first upper cladding layer 25, in the upper guide layer 24, or in the active layer 23. That is, the gain region 20a includes the p-n junction 25J at a position lower than a part corresponding to a foot of each of both sides of the ridge part 20A. The impurity diffusion region 25C has a Zn diffusion concentration of about $1\times10^{17}$ $cm^{-3}$ to about $1\times10^{19}$ $cm^{-3}$. It is to be noted that the second upper cladding layer 26 preferably has a C concentration that is lower than the Zn diffusion concentration of the impurity diffusion region 25C. In such a case, optical absorption performed by C becomes smaller, thus enhancing the optical output.

The contact layer 27 is exposed to a top surface of the gain region 20a. The etching stop layer 25A is exposed to both sides of the gain region 20a (both sides of a part, of the ridge part 20A, corresponding to the gain region 20a). The gain region 20a has a height corresponding to a thickness from a top surface of the etching stop layer 25A to a top surface of the contact layer 27. Each of both the sides of the gain region 20a (both the sides of the part, of the ridge part 20A, corresponding to the gain region 20a) is dug from the contact layer 27 to a location corresponding to the top surface of the etching stop layer 25A. The gain region 20a is configured by the impurity diffusion region 25C, the second upper cladding layer 26, and the contact layer 27, and serves as a p-type semiconductor region.

The contact layer 27 is exposed to a top surface of the Q-switch region 20b. The etching stop layer 25A is exposed to both sides of the Q-switch region 20b (both sides of a part, of the ridge part 20A, corresponding to the Q-switch region 20b). The Q-switch region 20b has a height corresponding to a thickness from the top surface of the etching stop layer 25A to the top surface of the contact layer 27. Each of both the sides of the Q-switch region 20b (both the sides of the part, of the ridge part 20A, corresponding to the Q-switch region 20b) is dug from the contact layer 27 to the top surface of the etching stop layer 25A. The Q-switch region 20b includes the p-n junction 25J provided in the ridge part 20A (i.e., at a position higher than the part corresponding to the foot of each of both the sides of the ridge part 20A).

The etching stop layer 25B is exposed to a top surface of the separation region 20c. A part, of the etching stop layer 25B, exposed to the top surface of the separation region 20c is a surface formed by wet etching, for example, and is cleaned with dilute hydrochloric acid, etc., for example. The etching stop layer 25A is exposed to both sides of the separation region 20c (both sides of a part, of the ridge part 20A, corresponding to the separation region 20c). A surface of a part, of the etching stop layer 25A, corresponding to the foot of each of both the sides of the ridge part 20A is a surface formed by wet etching, for example, and is cleaned with dilute hydrochloric acid, etc., for example. The separation region 20c has a height corresponding to a thickness from the top surface of the etching stop layer 25A to the top surface of the etching stop layer 25B. Each of both the sides of the separation region 20c (both the sides of the part, of the ridge part 20A, corresponding to the separation region 20c) is dug from the contact layer 27 to a location corresponding to the top surface of the etching stop layer 25A. The separation groove 20B separates the adjacent gain region 20a and Q-switch region 20b from each other by a space. A bottom surface of the separation groove 20B is provided in the first upper cladding layer 25. Specifically, the bottom surface of the separation groove 20B corresponds to the top surface of the etching stop layer 25B, and is provided at a position higher than the part (the etching stop layer 25A) corresponding to the foot of each of both the sides of the ridge part 20A. The separation region 20c has a width (a width of the ridge part 20A in a width-direction) D3 that is larger than a width D1 of the gain region 20a as well as a width D2 of the Q-switch region 20b. This makes it possible to suppress scattering of guided light caused by the separation groove 20B. A part, of the separation region 20c, corresponding to a bottom of the separation groove 20B is configured by the first upper cladding layer 25 (including the etching stop layers 25A and 25B), and serves as the n-type semiconductor region.

The second upper cladding layer 26 is exposed to a top surface of the current non-injection region 20d. The etching stop layer 25A is exposed to both sides of the current non-injection region 20d (both sides of a part, of the ridge part 20A, corresponding to the current non-injection region 20d). The current non-injection region 20d has a height corresponding to a thickness from the top surface of the etching stop layer 25A to a top surface of the second upper cladding layer 26. Each of both the sides of the current non-injection region 20d (both the sides of the part, of the ridge part 20A, corresponding to the current non-injection region 20d) is dug from the contact layer 27 to a location corresponding to the top surface of the etching stop layer 25A.

The semiconductor laser 1 further includes, on the semiconductor layer 20, for example, an insulating layer 28, a dielectric layer 29, a gain electrode 31, a Q-switch electrode 32, and pad electrodes 33 and 34. The insulating layer 28 is a layer that protects the semiconductor layer 20, and covers an entire top surface of the semiconductor layer 20. The insulating layer 28 is configured, for example, by an insulating inorganic material such as $SiO_2$. The dielectric layer 29 is a layer that reduces capacitance of each of the pad electrodes 33 and 34. The dielectric layer 29 is provided in contact with a part, of a surface of the insulating layer 28, immediately above the bank part 20C, and is configured, for example, by $SiO_2$, polyimide, or the like.

The insulating layer 28 has a plurality of openings on respective parts immediately above the ridge part 20A. The plurality of openings provided in the insulating layer 28 are assigned on a one-to-one basis to respective gain regions 20a and respective Q-switch regions 20b. The gain electrode 31 is formed in the opening formed at a part, of the insulating layer 28, immediately above the gain region 20a. The gain electrode 31 is formed in contact with the top surface of the ridge part 20A (the top surface of the contact layer 27). The gain electrode 31 is an electrode that injects a current into the gain region 20a, and is configured by a metal material. The Q-switch electrode 32 is formed in the opening formed at a part, of the insulating layer 28, immediately above the Q-switch region 20b. The Q-switch electrode 32 is formed in contact with the top surface of the ridge part 20A (the top surface of the contact layer 27). The Q-switch electrode 32 is an electrode that applies a bias voltage to the Q-switch region 20b, and is configured by a metal material.

The pad electrodes 33 and 34 are each formed on the bank part 20C, and is specifically formed on the dielectric layer 29. The pad electrode 33 is an electrode for bonding of a wire 203, and is electrically coupled to the gain electrode 31. The pad electrode 34 is an electrode for bonding of a wire 204, and is electrically coupled to the Q-switch electrode 32. The pad electrodes 33 and 34 are each configured by a metal material.

The semiconductor laser 1 further includes, for example, a lower electrode 40 in contact with a back surface of the substrate 10. The lower electrode 40, as well as the gain electrode 31 and the Q-switch electrode 32, is an electrode for driving of the semiconductor laser 1. The lower electrode 40 is configured by a metal material. In a case where the semiconductor laser 1 is mounted on the sub-mount 201, the lower electrode 40 is coupled to a sheet-shaped electrode 202 on the sub-mount 201 via, for example, a solder such as AuSn. The electrode 202 is also an electrode for bonding of the wire 205. The sub-mount 201 is configured by an insulating material having a high heat dissipation property.

[Manufacturing Method]

Next, description is given of a manufacturing method of the semiconductor laser 1 according to the present embodiment. FIG. 9 illustrates a cross-sectional configuration example of a wafer in a manufacturing process of the semiconductor laser 1. FIG. 10 illustrates a cross-sectional configuration example of the wafer in a manufacturing process subsequent to FIG. 9. FIG. 11 illustrates a cross-sectional configuration example of the wafer in a manufacturing process subsequent to FIG. 10. FIGS. 12A, 12B, and 12C each illustrate a cross-sectional configuration example of the wafer in a manufacturing process subsequent to FIG. 11. FIG. 12A illustrates a cross-sectional configuration example of a location corresponding to the line B-B illustrated in FIG. 1. FIG. 12B illustrates a cross-sectional configuration example of a location corresponding to the line C-C illustrated in FIG. 1. FIG. 12C illustrates a cross-sectional configuration example of a location corresponding to the line D-D illustrated in FIG. 1. FIG. 13 illustrates a cross-sectional configuration example of the wafer in a manufacturing process subsequent to FIG. 12A.

In order to manufacture the semiconductor laser 1, for example, a compound semiconductor is formed at once on the substrate 10 including Si-doped n-type GaAs, by means of, for example, an epitaxial crystal growth method such as a metal organic chemical vapor deposition (MOCVD) method. Examples of a material to be used at this occasion for the compound semiconductor include a methyl-based organic metal gas such as trimethylaluminum (TMAl), trimethylgallium (TMGa), trimethylindium (TMIn), and arsine ($AsH_3$)

First, the substrate 10 (wafer) is placed in an MOCVD furnace. Next, the lower cladding layer 21 (e.g., Si-doped n-type $Al_{x1}Ga_{1-x1}As$) and the lower guide layer 22 (e.g., Si-doped n-type $Al_{x2}Ga_{1-x2}As$) are formed in this order on the substrate 10 (see FIG. 9). Subsequently, the active layer 23 (e.g., a multiple quantum well structure in which $Al_{0.1}Ga_{0.9}As$ and $Al_{0.4}Ga_{0.6}As$ are stacked alternately) is formed on the lower guide layer 22 (see FIG. 9). Next, the upper guide layer 24 (e.g., n-type $Al_{0.3}Ga_{0.7}As$) and the first upper cladding layer 25 (e.g., n-type $Al_{0.5}Ga_{0.5}As$) are formed in this order on the active layer 23 (see FIG. 9). At this occasion, in the first upper cladding layer 25, the etching stop layer 25A (e.g., n-type $Al_{0.3}Ga_{0.7}As$) and the etching stop layer 25B (e.g., n-type $Al_{0.3}Ga_{0.7}As$) are formed apart from each other on the upper guide layer 24 (see FIG. 9).

In this example, the epitaxial growth by means of the MOCVD method may lead to inclusion of C that functions as an acceptor in some cases. Thus, for example, Si having a concentration equal to or higher than that of the acceptor may be doped to adjust an average carrier concentration excluding a compensation amount to $1 \times 10^{17}$ $cm^{-3}$ or lower. Further, in the active layer 23, only the barrier layer may be doped with Si to adjust the average carrier concentration to $1 \times 10^{17}$ $cm^{-3}$ or lower. In a case where only the barrier layer is doped with Si in the active layer 23, it is possible to compensate the acceptor without lowering a light emission efficiency because of no excessive doping performed on the well layer. It is to be noted that Se may be used instead of Si as the n-type dopant.

Next, the substrate 10 (wafer) is taken out of the MOCVD furnace. Next, Zn is diffused to a predetermined region of a surface of the first upper cladding layer 25. This allows the impurity diffusion region 25C to be formed (see FIG. 9). At this occasion, Zn is diffused not only to a part to be the ridge part 20A, but also to parts corresponding to both the sides of the ridge part 20A. This makes it possible to easily uniformize a Zn concentration of the part to be the ridge part 20A. A solid phase diffusion method using a ZnO film or a vapor phase diffusion method may be used for diffusion of Zn. For example, the ZnO film is formed in the predetermined region of the surface of the first upper cladding layer 25 to perform solid phase diffusion. Thereafter, the ZnO film is detached to cover the entire surface of the first upper cladding layer 25 with SiN, etc. Thereafter, the substrate 10 (wafer) is annealed, thereby diffusing Zn from a surface layer to a deep part of the first upper cladding layer 25, thus making it possible to decrease the Zn concentration of the surface layer to a desired concentration.

Next, the surface of the first upper cladding layer 25 is cleaned with dilute hydrochloric acid, etc., and thereafter the substrate 10 (wafer) is placed again in the MOCVD furnace. Next, the second upper cladding layer 26 (e.g., C-doped p-type $Al_{0.5}Ga_{0.5}As$) and the contact layer 27 (e.g., C-doped p-type GaAs) are formed in this order on the first upper cladding layer 25. In this manner, the semiconductor layer 20 is formed on the substrate 10 (see FIG. 10).

Next, the substrate 10 (wafer) is taken out of the MOCVD furnace. Next, a CVD method, etc., for example, is used to form a hard mask (a film including $SiO_2$, etc.) in a predetermined pattern on the surface of the semiconductor layer 20 (the contact layer 27). Next, a dry etching method, for example, is used to selectively etch the semiconductor layer 20 via an opening formed in the hard mask, thereby, for example, digging the semiconductor layer 20 to a location immediately before reaching the etching stop layer 25B. Thereafter, for example, a wet etching method employing hydrofluoric acid is used to selectively etch the semiconductor layer 20 via the opening formed in the hard mask, thereby, for example, digging the semiconductor layer 20 to the etching stop layer 25B. In this manner, the separation groove 20B is formed (see FIG. 11). Thereafter, the above-described hard mask is removed.

Next, a CVD method, for example, is used to newly form a hard mask (a film including $SiO_2$, etc.) in a predetermined pattern. Next, a dry etching method, for example, is used to selectively etch the semiconductor layer 20 via an opening formed in the hard mask, thereby digging a location corresponding to each of both the sides of the ridge part 20A to a location immediately before reaching the etching stop layer 25A. Thereafter, for example, a wet etching method employing hydrofluoric acid is used to selectively etch the semiconductor layer 20 via the opening formed in the hard mask, thereby, for example, digging the semiconductor layer 20 to the etching stop layer 25A. In this manner, the ridge part 20A and the two bank parts 20C are formed (see FIGS. 12A, 12B, and 12C). Thereafter, the above-described hard mask is removed.

It is to be noted that only the dry etching may be used to form the separation groove 20B, the ridge part 20A, and the two bank parts 20C, without using the wet etching. In the case of the dry etching, it is possible to highly accurately grasp an etching depth on a real-time basis by monitoring optical interference. For example, upon reaching the etching stop layer 25B or the etching stop layer 25A, optical intensity varies in accordance with the optical interference, thus making it possible to recognize having reached a surface of the etching stop layer 25B or the etching stop layer 25A by capturing the variance in the optical intensity.

Next, for example, the CVD method, etc. is used to form the insulating layer 28 on an entire surface of each of components including the separation groove 20B, the ridge part 20A, and the two bank parts 20C (see FIG. 13). Next, for example, the CVD method, etc. is used to form the dielectric layer 29 on the insulating layer 28, immediately above the bank part 20C. Next, for example, a vapor deposition method, etc. is used to form the gain electrode 31 in the opening, of the insulating layer 28, formed immediately above each of the gain regions 20a, and to form the Q-switch electrode 32 in the opening, of the insulating layer 28, formed immediately above each of the Q-switch regions 20b (see FIG. 13). Next, for example, the vapor deposition method, etc. is used to form each of the pad electrodes 33 and 34 on the insulating layer 28 and the dielectric layer 29. Moreover, as necessary, the pad electrodes 33 and 34 are each made thicker as a film using a plating method, for example. By making each of the pad electrodes 33 and 34 thicker as a film, it becomes possible to prevent each of the pad electrodes 33 and 34 from severing between the ridge part 20A and the bank part 20C.

Next, as necessary, the back surface of the substrate 10 is ground to adjust a thickness of the substrate 10 to a desired thickness. Next, for example, the vapor deposition method, etc. is used to form the lower electrode 40 on the back surface of the substrate 10. Next, the substrate 10 (wafer) is subjected to cleavage to form the front end surface S1 and the rear end surface S2. Lastly, the anti-reflection film is formed on the front end surface S1, and the multilayer reflection film is formed on the rear end surface S2. In this manner, the semiconductor laser 1 is manufactured.

In the semiconductor laser 1 thus manufactured, a drive circuit (e.g., a laser driver 304 described later) applies, to the gain region 20a (the gain electrode 31), for example, a forward bias (a pulse voltage V1) having an amplitude of several volts and a pulse width of a nano-second (ns) order (e.g., about 1 ns). Further, the drive circuit (e.g., the laser driver 304 described later) applies, to the Q-switch region 20b (the Q-switch electrode 32), for example, a reverse bias (a voltage V2) of negative several volts (voltage V2<0) (e.g., FIGS. 15 and 16). At this occasion, for example, the voltage V2 either may be a fixed value as illustrated in FIG. 15, or may be a pulse voltage according to application of the pulse voltage V1 as illustrated in FIG. 16. The voltage V2 may be, for example, a pulse voltage that has a peak in a negative direction at a peak time of the pulse voltage V1. At this occasion, in the gain region 20a, carriers are gradually accumulated in the active layer 23, as a current flowing into the gain region 20a becomes larger in association with the application of the pulse voltage V1. At a point in time when the carrier density exceeds an oscillation threshold, a photon density increases rapidly to cause laser oscillation to occur. This causes accumulated electron-hole pairs to be rapidly consumed, and, from a point in time when the carrier density falls below an oscillation threshold density, the photon density rapidly decreases to stop the laser oscillation. This allows for obtainment of a laser light pulse of a pulse width (a pulse width of 200 ps or less, for example) shorter than a pulse width of the pulse voltage V1 itself, as indicated by a thick line in FIG. 17.

It is to be noted that a broken line in FIG. 17 indicates an example of a laser light pulse in a case where the Q-switch region 20b is grounded. The laser light pulse indicated by the broken line in FIG. 17 has a pulse width of about sub-ns. In a case where the Q-switch region 20b is grounded, there is less voltage drop caused by a photovoltaic current generated in the Q-switch region 20b; the Q-switch region 20b operates as a absorbent having less voltage fluctuation, thus allowing for obtainment of an optical pulse closer to a waveform of the pulse voltage V1.

It has been known, for a behavior of the carrier density of the active layer in the Q-switch operation, that a modeling is possible using traveling-wave rate equation (TRE) (Reference Literature: Ultrafast diode lasers, Peter Vasilev, Atech House Publishers). FIGS. 18, 19, and 20 each illustrate an example of results of verification of a model in accordance with the semiconductor laser 1 performed uniquely by the present inventors with reference to a TRE method. FIG. 18 illustrates a transient response after provision of two gain regions 20a at a resonator length of 1,000 μm and input of a step current of 4 A. FIG. 19 illustrates a transient response after provision of five gain regions 20a at a resonator length of 1,000 μm and input of a step current of 4 A. FIG. 20 illustrates a transient response after provision of nine gain regions 20a at a resonator length of 1,000 μm and input of a step current of 4 A. In all of FIGS. 18, 19, and 20, a reverse bias is applied to the Q-switch region 20b.

The carrier density of the gain region 20a gradually increases to reach a peak value ($1.2 \times 10^{25}$ cm$^{-3}$) at about 0.6 ns. Meanwhile, at an end of the gain region 20a, the carrier density is saturated at a degree slightly larger than a transparent carrier density. One reason for this is that light in each of the gain regions 20a promotes stimulated emission. In FIG. 19, a region where the carrier density is reduced due to the stimulated emission is decreased. It is appreciated, in FIG. 20, that an average carrier density is increased. In this manner, in a Q-switch semiconductor laser in which high current injection is performed into the gain region 20a, it is preferable that the gain regions 20a each have a length of 500 μm or less, desirably 300 μm or less. However, due to increase in the number of division of the resonator length, the number of the separation region is increased, thus lowering combined resistance of a part between the gain region 20a and the Q-switch region 20b. The number of the division is preferably adjusted to allow the combined resistance to be 100 kohms or more.

A carrier lifetime of the gain region 20a depends on the square of the carrier density. Accordingly, the carrier lifetime of the gain region 20a is saturated at the time of the high current injection. A typical semiconductor laser performs laser oscillation at a carrier density sufficiently lower than a saturation carrier density. When a reverse bias is adjusted to allow a loss of the Q-switch region 20b to be barely lower than a maximum gain in the saturation carrier density of the gain region 20a, the laser oscillation occurs. In a case, for example, where the reverse bias is applied through high resistance in accordance with FIG. 15, voltage drop occurs due to a photocurrent of the Q-switch region 20b, and thus the reverse bias becomes small to cause a Q-value of the semiconductor laser 1 to increase sharply. This allows for obtainment of pulse light having a high peak value. When a current leakage from the gain region 20a to the Q-switch region 20b becomes larger, voltage drop occurs at a high resistance. Accordingly, there are several undesirable influences such as difficulty in application of the reverse bias to the Q-switch region 20b, a lowered peak value of the pulse light due to smaller fluctuation of the Q-value, or increase in the pulse width. As such a passive Q-switch method, the structure of the semiconductor laser 1 according to the present embodiment is applicable.

Meanwhile, as illustrated in FIGS. 18, 19, and 20, the carrier density of the gain region 20a reaches a peak value about 0.6 ns behind. In accordance with FIG. 16, the reverse voltage is applied to the Q-switch region 20b before application of a pulse current of the gain region 20a, and the loss of the Q-switch region 20b is actively lowered after the saturation of the carrier density of the gain region 20a; at this occasion, a gain exceeds the loss, thus causing the laser oscillation to occur. The photocurrent of the Q-switch region 20b undergoes voltage drop similarly to the passive Q-switch method. Accordingly, an increasing speed of the Q-value is enhanced, thus allowing for obtainment of the pulse light having a high peak value. A saturation time of the carrier density is within about 3 ns, because it depends on a structure, etc. of the active layer 23. Accordingly, it is not desirable that a width of the pulse current for the gain region 20a be 5 ns or more, because of increase in a reactive current.

[Effects]

Next, description is given of effects of the semiconductor laser 1 according to the present embodiment.

There has been remarkable progress in recent 3D shape measurement techniques, and such 3D shape measurement techniques have been actively utilized in fields such as a gesture input in game devices and various electronics products as well as preventive safety and automatic driving of automobiles. Laser radar using a time-of-flight (TOF) method is a direct method that allows for measurement of time until pulse light having been applied to an object is scattered and returned as well as measurement of a distance to the object; the laser radar has been widely used. The laser radar has limitations on a range of use, depending on performance of devices that configure a system. The higher a pulse energy of a laser light source becomes, the longer a distance to be measured becomes, allowing distance accuracy to be enhanced. There are many industrial advantages of the semiconductor laser that is able to directly generate pulse light, as follows: it is possible to provide the semiconductor laser in a smaller size and less expensively; and it is possible to achieve a high electricity-light conversion efficiency and lower power consumption. B. Lanz et al. obtains a pulse width of 80 ps and a pulse energy of 3 nJ using a wide-stripe semiconductor laser having a saturable absorption property (Brigitte Lanz, Boris S. Ryvkin, Eugene A. Avrutin, and Juha T. Kostamovaara, "Performance improvement by a saturable absorber in gain-switched asymmetric-waveguide laser diodes." Opt. Express 29781, V01. 21, 2013).

In order to increase a pulse energy using a semiconductor laser, it is necessary to increase the number of carriers to be injected into a gain region. Accordingly, several method are employed as follows: increasing a thickness of the active layer; increasing a width of a stripe; and applying the reverse bias to a saturable absorption region to increase variation in the Q-value. The method of varying the Q-value in the resonator in this manner is referred to as a Q-switch semiconductor laser. A passive Q-switch semiconductor laser passively induces variation in the Q-value. An active Q-switch pulse semiconductor laser is able to modulate the reverse bias to be applied to the Q-switch region to further increase the variation in the Q-value. In order to further increase the pulse energy, it is necessary to increase the variation in the Q-value and to further increase a voltage to be applied to the gain region. In particular, in a case where a watt-class pulse peak value is obtained using a narrow stripe structure having a stripe width of several μm or less, a potential difference between the Q-switch region and the gain region becomes larger to reach 10 V or higher.

However, a typical Q-switch pulse semiconductor laser including AlGaAs, etc. has a small resistance between the Q-switch region and the gain region. Accordingly, when the potential difference between the Q-switch region and the gain region becomes larger, a leakage current between the Q-switch region and the gain region is increased. Such a leakage current inhibits the Q-switch operation due to various factors. For example, the passive Q-switch pulse semiconductor laser has a smaller variation in the Q-value when the leakage current becomes larger than a photocurrent of the Q-switch region. It is necessary for the active Q-switch pulse semiconductor laser to increase an allowable current of a switching element, thus lowering a switching speed.

It is conceivable to form a groove in the separation region as a method of increasing a resistance between the Q-switch region and the gain region. The formation of the groove in the separation region causes increase in guide loss, increase in stimulated emission in the gain region due to light reflection in the separation region, and lowering of a pulse energy due to laser oscillation. As a method of increasing a resistance between two electrodes while maintaining optical coupling between the two electrodes, it has been proposed to provide, in a region distant from a light emission region, a separation groove that reaches a substrate, and to remove, in a vicinity of the light emission region, only a n-type GaAs electrode layer in a surface layer (Japanese Unexamined Patent Application Publication No. H1-262683). In such a case, however, a p-type AlGaAs cladding layer exists under the n-type GaAs electrode layer, thus causing a current leakage to occur via the p-type AlGaAs cladding layer. As another method of increasing a resistance between two electrodes, there has been proposed a method of performing ion injection between the two electrodes (Japanese Unexamined Patent Application Publication No. 2008-258274). In such a case, however, there is a possibility that increase in defect due to the ion injection may cause increase in the guide loss to lower long-term reliability. Further, in a case where a conductivity type is inversed by the ion injection, a current path is generated in an inversion region due to the defect, etc., thus making it difficult to ignore the influence due to the current leakage.

In contrast, in the semiconductor laser 1 according to the present embodiment, when the reverse bias voltage is applied to the Q-switch region 20b, for example, a depletion region 35 is formed in the Q-switch region 20b, as illustrated in FIG. 14. In this example, the active layer 23 has a thickness of 200 nm, the upper guide layer 24 has a thickness of 100 nm, and the first upper cladding layer 25 has a thickness of 350 nm. In addition, the active layer 23, the upper guide layer 24, and the first upper cladding layer 25 have an average carrier density of $1 \times 10^{17}$ cm$^{-3}$. In such a case, when the reverse bias voltage of −10 V is applied to the Q-switch region 20b, a lower end of the depletion region 35 is located at 375 nm from the p-n junction 25J. Moreover, the active layer 23 has a thickness of 200 nm, the upper guide layer 24 has a thickness of 100 nm, and the first upper cladding layer 25 has a thickness of 350 nm. In addition, the active layer 23, the upper guide layer 24, and the first upper cladding layer 25 have an average carrier density of $5 \times 10^{16}$ cm$^{-3}$. In such a case, when the reverse bias voltage of −10 V is applied to the Q-switch region 20b, the lower end of the depletion region 35 is located at 550 nm from the p-n junction 25J. In both cases, the lower end of the depletion region 35 is located in the active layer 23. Accordingly, holes generated by optical absorption are immediately discharged from an electric field applied to the active layer 23, and an amount of optical absorption is increased. Further, the depletion region 35 expands up to the separation region 20c, and thus a part between the gain region 20a and the Q-switch region 20b (i.e., the separation region 20c) has a higher resistance of 100 kohms or more. As a result, it becomes possible to cause a current leakage from the gain region 20a to the Q-switch region 20b to be 1 mA or less, and thus to make the current leakage small enough to be almost ignored. Moreover, light scattering of carriers in the gain region 20a is suppressed to increase injection carrier density, thus making it possible to allow for higher power of the semiconductor laser 1.

2. Modification Examples of First Embodiment

Next, description is given of a modification example of the semiconductor laser 1 according to the foregoing embodiment.

Modification Example A

In the foregoing embodiment, for example, the width (the width of the ridge part 20A in the width-direction) D3 of the separation region 20c may be equal to the width D1 of the gain region 20a and to the width D2 of the Q-switch region 20b, as illustrated in FIG. 21. In such a case as well, an optical loss in the separation groove 20B is very small, and thus it becomes possible to allow for higher power of the semiconductor laser 1.

Modification Example B

In the foregoing embodiment and the modification example thereof, for example, the impurity diffusion region 25C may be provided only in the ridge part 20A, as illustrated in FIG. 22. In such a case as well, it is possible to homogenize impurity density in the impurity diffusion region 25C.

Modification Example C

In the foregoing embodiment and the modification examples thereof, for example, a region similar to the impurity diffusion region 25C (an impurity diffusion region 25D) may be provided also in the Q-switch region 20b, as illustrated in FIG. 23. In this case, the p-n junction 25J is formed at a position lower than the part corresponding to the foot of each of both the sides of the ridge part 20A. However, the depletion region 35 expands up to the separation region 20c, and thus the part between the gain region 20a and the Q-switch region 20b (i.e., the separation region 20c) has a higher resistance of 100 kohms or more. As a result, it becomes possible to cause a current leakage from the gain region 20a to the Q-switch region 20b to be 1 mA or less, and thus to make the current leakage small enough to be almost ignored.

Modification Example D

In the foregoing embodiment and the modification examples thereof, for example, the etching stop layers 25A and 25B may be omitted, as illustrated in FIGS. 24, 25, and 26.

Modification Example E

In the foregoing embodiment and the modification examples thereof, the bottom surface of the separation groove 20B may not necessarily be a flat surface. Specifically, in the bottom surface of the separation groove 20B, a height of a middle part in the width-direction of the ridge part 20A may be higher than a height of a part close to the foot of each of both the sides of the ridge part 20A. For example, the bottom surface of the separation groove 20B may have a convex shape in the width-direction of the ridge part 20A, as illustrated in FIGS. 27 and 28. FIGS. 27 and 28 each illustrate an example in which the bottom surface of the separation groove 20B has a gentle slope in the width-direction of the ridge part 20A. Further, FIG. 27 illustrates an example in which the etching stop layer 25B is omitted. Further, FIG. 28 illustrates an example in which the etching stop layers 25A and 25B are omitted.

Similarly to the foregoing embodiment, the convex shape (or a convexly curved surface shape) of the bottom surface of the separation groove 20B makes it possible to make a current leakage from the gain region 20a to the Q-switch region 20b small enough to be almost ignored. Moreover, light scattering of carriers in the gain region 20a is suppressed to increase injection carrier density, thus making it possible to allow for higher power of the semiconductor laser 1.

Incidentally, etching utilizing a micro-loading effect, for example, may be cited as a manufacturing method to allow the bottom surface of the separation groove 20B to have the convex shape (or the convexly curved surface shape) illustrated in the present modification example. FIG. 29 is an explanatory diagram that describes the micro-loading effect. In FIG. 29, a horizontal axis indicates an opening width of a mask to be used for the etching, and a vertical axis indicates an etching depth to be obtained when performing the etching via the opening of the mask. The micro-loading effect is more likely to occur when the mask opening width falls below 10 μm, for example. The micro-loading effect occurs frequently when the mask opening width falls below 1 μm, for example.

In a case where the mask opening width is within a range where the micro-loading effect occurs, the etching depth becomes shallower as the mask opening width becomes narrower. Accordingly, in a case where the mask opening is in a stripe shape having a constriction in which the micro-loading effect occurs, for example, the etching depth becomes relatively shallow in a location of the constriction, whereas the etching depth becomes relatively deep in a location other than the constriction. Further, in a case where etching is performed using the mask having the opening in the stripe shape having the constriction in which the micro-loading effect occurs, a bottom surface of a groove part to be formed thereby has a convex shape in which a height of the location of the constriction is higher than a height of the location other than the constriction. For this reason, only adjusting the mask opening width makes it possible to allow the bottom surface of the separation groove 20B to have the convex shape (or the convexly curved surface shape).

The manufacturing method to allow the bottom surface of the separation groove 20B to have the convex shape (or the convexly curved surface shape) illustrated in the present modification example is not limited to the etching utilizing the micro-loading effect, but may be etching utilizing a gray-scale mask, for example. In this case, it is not necessary to narrow the mask opening width to a range where the micro-loading effect occurs.

Modification Example F

In the foregoing embodiment and Modification Examples A to E thereof, a width of each of the separation grooves 20B (a width in the extending direction of the ridge part 20A) may be uneven in the width-direction of the ridge part 20A. Specifically, in each of the separation grooves 20B, a width of the middle part in the width-direction of the ridge part 20A may be narrower than a width of the part close to the foot of each of both the sides of the ridge part 20A.

FIGS. 30 to 34 each illustrate an example of a top surface configuration of a portion of the ridge part 20A in the present modification example. In the present modification example, for example, in each of the separation grooves 20B, the width of the middle part in the width-direction of the ridge part 20A may be narrower than the width of the part close to the foot of each of both the sides of the ridge part 20A, as illustrated in FIGS. 30 to 34.

In a case where the width of each of the separation grooves 20B is configured as described above, for example, in the gain region 20a, a length L1c of the middle part in the width-direction of the ridge part 20A may be longer than a length L1s of the part close to the foot of the ridge part 20A. Further, in the case where the width of each of the separation grooves 20B is configured as described above, for example, in the Q-switch region 20b, a length L2c of the middle part in the width-direction of the ridge part 20A may be shorter than a length L2s of the part close to the foot of the ridge part 20A. Further, in the case where the width of each of the separation grooves 20B is configured as described above, the length L1c may be longer than the length L1s, and the length L2c may be shorter than the length L2s. Further, in the case where the width of each of the separation grooves 20B is configured as described above, the length L1c may be longer than the length L1s, and the length L2c may be equal to the length L2s. Further, in the case where the width of each of the separation grooves 20B is configured as described above, the length L1c may be equal to the length L1s, and the length L2c may be shorter than the length L2s.

In each of the separation grooves 20B, the width of the middle part in the width-direction of the ridge part 20A is narrower than the width of the part close to the foot of each of both the sides of the ridge part 20A, thereby causing the ridge part 20A to satisfy, for example, the following expression (1).

$$Lc > Le \tag{1}$$

$Lc = L1c \times$ the number of the gain region $20a - L2c \times$ the number of the separation region $20b$ $Le = L1s \times$ the number of the gain region $20a - L2s \times$ the number of the separation region $20b$ Lcenter: a length of each of the gain regions 20a and each of the Q-switch regions 20b in the middle part, of the ridge part 20A, in the width-direction Ledge: a length of each of the gain regions 20a and each of the Q-switch regions 20b in the part close to the foot, of the ridge part 20A, in the width-direction It is to be noted that, in a case where the lengths L1c in the respective gain regions 20a are not equal to one another, a term "the sum of lengths L1c of all of the gain regions 20a" is employed instead of the term "L1c×the number of the gain region 20a". Further, in a case where the lengths L1s in the respective gain regions 20a are not equal to one another, a term "the sum of lengths L1s of all of the gain regions 20a" is employed instead of the term "L1s×the number of the gain region 20a". Further, in a case where the lengths L2c in the respective separation regions 20b are not equal to one another, a term "the sum of lengths L2c of all of the separation regions 20b" is employed instead of the term "L2c×the number of the separation region 20b". Further, in a case where the lengths L2s in the respective separation regions 20b are not equal to one another, a term "the sum of lengths L2s of all of the separation regions 20b" is employed instead of the term "L2s×the number of the separation region 20b".

That is, in the ridge part 20A, a gain in the part close to the foot of each of both the sides of the ridge part 20A is smaller than a gain in the middle part in the width-direction of the ridge part 20A. As a result, oscillation in a high-order transverse mode is suppressed, thus making it possible to achieve a higher output in a basic transverse mode, even when the ridge width is widened to about 20 µm, for example.

In each of the gain regions 20a of the present modification example, an end surface facing the separation region 20c may include one or more convex shapes in the width-direction of the ridge part 20A. The convex shape at this occasion is, for example, the convexly curved surface shape having a gentle slope in the width-direction of the ridge part 20A, as illustrated in FIG. 30. It is to be noted that the convex shape at this occasion may be, for example, a wedge shape (or a V shape) having a flat surface sloped in the width-direction of the ridge part 20A, as illustrated in FIGS. 31, 32, and 33. Further, the convex shape at this occasion may include, for example, a concavo-convex shape that undulates in the width-direction of the ridge part 20A, as illustrated in FIG. 34.

The end surface facing the separation region 20c includes the one or more convex shapes in the width-direction of the ridge part 20A, thereby causing a distribution of a refractive index from the gain region 20a to the Q-switch region 20b, perceived by light that propagates in the ridge part 20A, to be gentle. In other words, in each of the gain regions 20a, the end surface facing the separation region 20c has a configuration in which the distribution of the refractive index from the gain region 20a to the Q-switch region 20b, perceived by light that propagates in the ridge part 20A, is gentle. This allows for suppression of reflection at the separation region 20c, thus leading to suppression of energy loss due to unnecessary resonance in the gain region 20a. As a result, it becomes possible to allow for higher power of the semiconductor laser 1.

In each of the Q-switch regions 20b of the present modification example, an end surface facing the separation region 20c may include one or more concave shapes that approximately follow the one or more convex shapes formed on the end surface in each of the gain regions 20a. The concave shape at this occasion is, for example, a concavely curved surface shape having a gentle slope in the width-direction of the ridge part 20A, as illustrated in FIG. 30. At this occasion, the concavely curved surface has a radius of curvature that is larger than a radius of curvature of the convexly curved surface formed on the end surface in each of the gain regions 20a; the width of the separation groove 20B may be uneven. It is to be noted that the concave shape at this occasion may be, for example, a notch shape having a flat surface sloped in the width-direction of the ridge part 20A, as illustrated in FIG. 31. Further, the concave shape at this occasion may include, for example, a concavo-convex shape that undulates in the width-direction of the ridge part 20A, as illustrated in FIG. 34.

The end surface facing the separation region 20c includes the one or more concave shapes that approximately follow the one or more convex shapes formed on the end surface in each of the gain regions 20a, thereby causing the distribution of the refractive index from the gain region 20a to the Q-switch region 20b, perceived by light that propagates in the ridge part 20A, to be gentle. In other words, in each of the Q-switch regions 20b, the end surface facing the separation region 20c has a configuration in which the distribution of the refractive index from the gain region 20a to the Q-switch region 20b, perceived by light that propagates in the ridge part 20A, is gentle. This allows for suppression of reflection at the separation region 20c, thus leading to suppression of energy loss due to unnecessary resonance in the gain region 20a. As a result, it becomes possible to allow for higher power of the semiconductor laser 1.

Further, in each of the gain regions 20a and each of the Q-switch regions 20b of the present modification example, the end surface facing the separation region 20B may have a configuration in which the distribution of the refractive index from the gain region 20a to the Q-switch region 20b, perceived by light that propagates in the ridge part 20A, is gentle. Specifically, for example, in one or both of each of the gain regions 20a and each of the Q-switch regions 20b, the end surface facing the separation region 20B may have the convex shape, the concave shape, or the concavo-convex shape in the width-direction of the ridge part 20A, as illustrated in FIGS. 30, 31, 32, and 34. This allows for suppression of reflection at the separation region 20c, thus leading to suppression of energy loss due to unnecessary resonance in the gain region 20a. As a result, it becomes possible to allow for higher power of the semiconductor laser 1.

In the present modification example (e.g., FIGS. 30 to 34), the width of each of the separation grooves 20B (the width in the extending direction of the ridge part 20A) may be within the range where the micro-loading effect occurs, at least in the middle part in the width-direction of the ridge part 20A. In this case, it is possible to form the convex shape (or the convexly curved surface shape) as illustrated in FIGS. 27 and 28 on the bottom surface of each of the separation grooves 20B by utilizing the micro-loading effect in forming each of the separation grooves 20B by means of selective etching using a mask. That is, in the bottom surface of the separation groove 20B of the present modification example, the height of the middle part in the width-direction of the ridge part 20A may be higher than the height of the part close to the foot of each of both the sides of the ridge part 20A.

It is to be noted that the width of each of the separation grooves 20B (the width in the extending direction of the ridge part 20A) may be within the range where the micro-loading effect occurs, irrespective of a position in the width-direction of the ridge part 20A. In this example, in a case where each of the separation grooves 20B is formed after formation of a ridge stripe in a manufacturing process, the ridge stripe preferably has a width of a size enough to cause occurrence of the micro-loading effect in forming each of the separation grooves 20B by means of the selective etching using a mask. At this occasion, the ridge stripe preferably has a width of at least 4 μm or more, for example.

Modification Example G

In each of the gain regions 20a of the foregoing embodiment and Modification Examples A to E thereof, the end surface facing the separation region 20c may include one or more convex shapes in the width-direction of the ridge part 20A. The convex shape at this occasion is, for example, the convexly curved surface shape having a gentle slope in the width-direction of the ridge part 20A, as illustrated in FIG. 35. It is to be noted that the convex shape at this occasion may be, for example, a wedge shape (or a V shape) having a flat surface sloped in the width-direction of the ridge part 20A, as illustrated in FIG. 36. Further, the convex shape at this occasion may include, for example, a concavo-convex shape that undulates in the width-direction of the ridge part 20A, as illustrated in FIG. 37.

The end surface facing the separation region 20c includes the one or more convex shapes in the width-direction of the ridge part 20A, thereby causing the distribution of the refractive index from the gain region 20a to the Q-switch region 20b, perceived by light that propagates in the ridge part 20A, to be gentle. In other words, in each of the gain regions 20a, the end surface facing the separation region 20c has a configuration in which the distribution of the refractive index from the gain region 20a to the Q-switch region 20b, perceived by light that propagates in the ridge part 20A, is gentle. This allows for suppression of reflection at the separation region 20c, thus leading to suppression of energy loss due to unnecessary resonance in the gain region 20a. As a result, it becomes possible to allow for higher power of the semiconductor laser 1.

In each of the Q-switch regions 20b of the present modification example, the end surface facing the separation region 20c may include one or more concave shapes that approximately follow the one or more convex shapes formed on the end surface in each of the gain regions 20a. The concave shape at this occasion is, for example, a concavely curved surface shape having a gentle slope in the width-direction of the ridge part 20A, as illustrated in FIG. 35. At this occasion, the concavely curved surface has a radius of curvature that is approximately equal to a radius of curvature of the convexly curved surface formed on the end surface in each of the gain regions 20a. It is to be noted that the concave shape at this occasion may be, for example, a notch shape having a flat surface sloped in the width-direction of the ridge part 20A, as illustrated in FIG. 36. Further, the concave shape at this occasion may include, for example, a concavo-convex shape that undulates in the width-direction of the ridge part 20A, as illustrated in FIG. 37.

The end surface facing the separation region 20c includes the one or more concave shapes that approximately follow the one or more convex shapes formed on the end surface in each of the gain regions 20a, thereby causing the distribution of the refractive index from the gain region 20a to the Q-switch region 20b, perceived by light that propagates in the ridge part 20A, to be gentle. In other words, in each of the Q-switch regions 20b, the end surface facing the separation region 20c has a configuration in which the distribution of the refractive index from the gain region 20a to the Q-switch region 20b, perceived by light that propagates in the ridge part 20A, is gentle. This allows for suppression of reflection at the separation region 20c, thus leading to suppression of energy loss due to unnecessary resonance in the gain region 20a. As a result, it becomes possible to allow for higher power of the semiconductor laser 1.

It is to be noted that, in the present modification example, for example, the width of each of the separation grooves 20B may be even irrespective of a position in the width-direction of the ridge part 20A, as illustrated in FIGS. 35 to 37. Further, in the present modification example, the width of each of the separation grooves 20B may be a value outside the range where the micro-loading effect occurs, irrespective of a position in the width-direction of the ridge part 20A.

Further, in each of the gain regions 20a and each of the Q-switch regions 20b of the present modification example, the end surface facing the separation region 20B may have a configuration in which the distribution of the refractive index from the gain region 20a to the Q-switch region 20b, perceived by light that propagates in the ridge part 20A, is gentle. Specifically, for example, in one or both of each of the gain regions 20a and each of the Q-switch regions 20b, the end surface facing the separation region 20B may have the convex shape, the concave shape, or the concavo-convex shape in the width-direction of the ridge part 20A, as illustrated in FIGS. 35, 36, and 37. This allows for suppression of reflection at the separation region 20c, thus leading to suppression of energy loss due to unnecessary resonance in the gain region 20a. As a result, it becomes possible to allow for higher power of the semiconductor laser 1.

Modification Example H

Further, in each of the gain regions 20a and each of the Q-switch regions 20b of the foregoing embodiment and Modification Examples A to E thereof, the end surface facing the separation region 20B may have a configuration in which the distribution of the refractive index from the gain region 20a to the Q-switch region 20b, perceived by light that propagates in the ridge part 20A, is gentle. Specifically, for example, in one or both of each of the gain regions 20a and each of the Q-switch regions 20b, the end surface facing the separation region 20B may have the convex shape, the concave shape, or the concavo-convex shape in the width-direction of the ridge part 20A, as illustrated in FIGS. 35, 36, and 37. This allows for suppression of reflection at the separation region 20c, thus leading to suppression of energy loss due to unnecessary resonance in the gain region 20a. As a result, it becomes possible to allow for higher power of the semiconductor laser 1.

Modification Example I

In the foregoing Modification Examples F to H, the bottom surface of each of the separation grooves 20B may be of the same height as the part corresponding to the foot of each of both the sides of the ridge part 20A. In this case as well, it is possible to achieve the effects described in the forgoing Modification Examples F to H.

2. Second Embodiment

Next, description is given of a distance measuring unit 3 according to a second embodiment of the present disclosure. FIG. 40 illustrates a schematic configuration example of the distance measuring unit 3. The distance measuring unit 3 measures a distance to a test object 100 by means of a time-of-flight (TOF) method. The distance measuring unit 3 includes the semiconductor laser device 2 as a light source. The distance measuring unit 3 includes, for example, the semiconductor laser device 2, a light-receiving section 301, lenses 302 and 302, the laser driver 304, an amplifier section 305, a measuring section 306, a control section 307, and an operation section 308.

The light-receiving section 301 detects light reflected by the test object 100. The light-receiving section 301 is configured by a photodetector, for example. The light-receiving section 301 may be configured by an avalanche photo diode (APD), a single-photon avalanche diode (SPAD), a multi-pixel single-photon avalanche diode (MP-SPAD), or the like. The lens 302 is a lens that collimates light emitted from the semiconductor laser device 2; the lens 302 is a collimating lens. The lens 303 is a lens that condenses light reflected by the test object 100 and guides the condensed light to the light-receiving section 301; the lens 303 is a condensing lens.

The laser driver 304 is, for example, a driver circuit that drives the semiconductor laser device 2 (the semiconductor laser 1). The amplifier section 305 is, for example, an amplifier circuit that amplifies a detection signal outputted from the light-receiving section 301. The measuring section 306 is, for example, a circuit that generates a signal corresponding to a difference between a single inputted from the amplifier section 305 and a reference signal. The measuring section 306 is configured by a Time to Digital Converter (TDC), for example. The reference signal may be either a signal inputted from the control section 307 or an output signal of a detection section that directly detects an output of the semiconductor laser device 2. The control section 307 is, for example, a processor that controls the light-receiving section 301, the laser driver 304, the amplifier section 305, and the measuring section 306. The operation section 308 is a circuit that derives distance information on the basis of the signal generated by the measuring section 306.

The distance measuring unit 3 may include, for example, a polarization beam splitter (PBS) 309 between the lens 302 and the test object 100 as well as a reflection mirror 310 that causes light reflected by the PBS 309 to enter the light-receiving section 301, as illustrated in FIG. 41. In such a case, light emitted from the semiconductor laser device 2 and light reflected by the test object 100 pass through the same optical path between the PBS 309 and the test object 100, thus making it possible to enhance measuring accuracy.

The distance measuring unit 3 may include, between the lens 302 and the test object 100, a scanning section 311 that scans the light emitted from the semiconductor laser device 2, for example, as illustrated in FIG. 42. For example, the scanning section 311 performs measurement of distance information of the test object 100 on a single axis, i.e., two-dimensional measurement. The distance measuring unit 3 illustrated in FIG. 41 performs distance measurement of only one location of the test object 100, i.e., one-dimensional measurement of only a range direction. In contrast, the distance measuring unit 3 illustrated in FIG. 42 includes the scanning section 311, thus making it possible to perform the two-dimensional measurement.

For example, the scanning section 311 may perform measurement of distance information of the test object 100 on two axes, i.e., three-dimensional measurement. In such a case, it is possible for the distance measuring unit 3 illustrated in FIG. 42 to perform the three-dimensional measurement.

The distance measuring unit 3 may include, for example, the PBS 309, the reflection mirror 310, and the scanning section 311, as illustrated in FIG. 43. In such a case, it is possible not only to enhance measuring accuracy but also to perform the two-dimensional measurement or the three-dimensional measurement.

In the present embodiment, the semiconductor laser device 2 is used as a light source in the distance measuring unit 3. This makes it possible to emit high-power laser light and thus to enhance detection accuracy.

Although the present disclosure has been described hereinabove with reference to a plurality of embodiments and modification examples thereof, the present disclosure is not limited to the foregoing respective embodiments, and may be modified in a variety of ways. It is to be noted that the effects described herein are merely examples. The effects of the present disclosure are not limited to those described herein. The present disclosure may have effects other than those described herein.

Moreover, for example, the present disclosure may have the following configurations.

(1)

A semiconductor laser including, on a semiconductor substrate:

a first semiconductor layer of a first conductivity type;

an active layer;

a second semiconductor layer of the first conductivity type;

a third semiconductor layer of a second conductivity type, in order; and a ridge part formed in the second semiconductor layer and the third semiconductor layer, and extending in a stacked in-plane direction, the ridge part having a structure in which a plurality of gain regions and a plurality of Q-switch regions are each disposed alternately with each of separation regions being interposed therebetween in an extending direction of the ridge part, the separation regions each having a separation groove that separates from each other, by a space, the gain region and the Q-switch region adjacent to each other, the separation groove having a bottom surface at a position, in the second semiconductor layer, higher than a part corresponding to a foot of each of both sides of the ridge part.

(2)

The semiconductor laser according to (1), in which the second semiconductor layer includes a first different-composition-ratio semiconductor layer having a composition ratio different from a composition ratio of another part of the second semiconductor layer, and the bottom surface is a portion of a top surface of the first different-composition-ratio semiconductor layer.

(3)

The semiconductor laser according to (2), in which the second semiconductor layer includes a second different-composition-ratio semiconductor layer having a composition ratio different from the composition ratio of the other part of the second semiconductor layer, and a top surface of the part corresponding to the foot of each of both the sides of the ridge part is a portion of a top surface of the second different-composition-ratio semiconductor layer.

(4)

The semiconductor laser according to (3), in which each of the bottom surface and the top surface of the part corresponding to the foot of each of both the sides of the ridge part is a surface formed by wet etching.

(5)

The semiconductor laser according to any one of (1) to (4), in which the Q-switch region includes an interface between the second semiconductor layer and the third semiconductor layer at a position higher than the part corresponding to the foot of each of both the sides of the ridge part.

(6)

The semiconductor laser according to any one of (1) to (5), in which the second semiconductor layer includes, at a part corresponding to each of the gain regions, a first impurity diffusion region of the second conductivity type, and each of the gain regions includes a p-n junction at a position lower than the part corresponding to the foot of each of both the sides of the ridge part.

(7)

The semiconductor laser according to any one of (1) to (6), in which the second semiconductor layer includes, at a part corresponding to each of the Q-switch regions, a second impurity diffusion region of the second conductivity type, and each of the Q-switch regions includes a p-n junction at a position lower than the part corresponding to the foot of each of both the sides of the ridge part.

(8)

The semiconductor laser according to any one of (1) to (7), in which, in the bottom surface, a height of a middle part in a width-direction of the ridge part is higher than a height of a part close to the foot of each of both the sides of the ridge part.

(9)

The semiconductor laser according to (8), in which, in each separation groove, a width of the middle part in the width-direction of the ridge part is narrower than a width of the part close to the foot of each of both the sides of the ridge part.

(10)

The semiconductor laser according to any one of (1) to (9), in which, in each separation groove, the width of the middle part in the width-direction of the ridge part is narrower than the width of the part close to the foot of each of both the sides of the ridge part.

(11)

The semiconductor laser according to any one of (1) to (10), in which in each of the gain regions, an end surface facing the separation region includes one or more convex shapes in the width-direction of the ridge part, and in each of the Q-switch regions, an end surface facing the separation region includes one or more concave shapes that approximately follow the one or more convex shapes.

(12)

The semiconductor laser according to any one of (1) to (11), in which, in each of the gain regions and each of the Q-switch regions, the end surface facing the separation region has a configuration in which a distribution of a refractive index from the gain region to the Q-switch region, perceived by light that propagates in the ridge part, is gentle.

(13)

The semiconductor laser according to (12), in which, in one or both of each of the gain regions and each of the Q-switch regions, the end surface facing the separation region has a convex shape, a concave shape, or a concavo-convex shape in the width-direction of the ridge part.

(14)

An electronic apparatus including a semiconductor laser as a light source, the semiconductor laser including, on a semiconductor substrate, a first semiconductor layer of a first conductivity type, an active layer, a second semiconductor layer of the first conductivity type, a third semiconductor layer of a second conductivity type, in order, and a ridge part formed in the second semiconductor layer and the third semiconductor layer, and extending in a stacked in-plane direction, the ridge part having a structure in which a plurality of gain regions and a plurality of Q-switch regions are each disposed alternately with each of separation regions being interposed therebetween in an extending direction of the ridge part, the separation regions each having a separation groove that separates from each other, by a space, the gain region and the Q-switch region adjacent to each other, the separation groove having a bottom surface at a position, in the second semiconductor layer, higher than a part corresponding to a foot of each of both sides of the ridge part.

(15)

The electronic apparatus according to (14), further including a drive section that drives the semiconductor laser, the drive section applying a forward bias pulse voltage to the gain region, and the drive section applying a reverse bias to the Q-switch region.

(16)

A method of driving a semiconductor laser, the semiconductor laser including, on a semiconductor substrate, a first semiconductor layer of a first conductivity type, an active layer, a second semiconductor layer of the first conductivity type, a third semiconductor layer of a second conductivity type, in order, and a ridge part formed in the second semiconductor layer and the third semiconductor layer, and extending in a stacked in-plane direction, the ridge part having a structure in which a plurality of gain regions and a plurality of Q-switch regions are each disposed alternately with each of separation regions being interposed therebetween in an extending direction of the ridge part, the separation regions each having a separation groove that separates from each other, by a space, the gain region and the Q-switch region adjacent to each other, the separation groove having a bottom surface at a position, in the second semiconductor layer, higher than a part corresponding to a foot of each of both sides of the ridge part, the method including:

applying a forward bias pulse voltage to the gain region; and applying a reverse bias to the Q-switch region.

(17)

The method of driving the semiconductor laser according to (16), in which the pulse voltage has a pulse width of a nano-second order.

This application claims the benefit of Japanese Priority Patent Application JP2016-164934 filed with the Japan Patent Office on Aug. 25, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor laser, comprising:
a semiconductor substrate;
a first semiconductor layer of a first conductivity type;
an active layer;
a second semiconductor layer of the first conductivity type;
a third semiconductor layer of a second conductivity type, wherein the first semiconductor layer of the first conductivity type, the active layer, the second semiconductor layer of the first conductivity type, and the third semiconductor layer of the second conductivity type are in respective order on the semiconductor substrate; and
a ridge part in the second semiconductor layer and the third semiconductor layer, wherein
the ridge part extends in a stacked in-plane direction,
the ridge part has a structure in which a plurality of gain regions and a plurality of Q-switch regions are each disposed alternately and a separation region is interposed between each gain region of the plurality of gain regions and each Q-switch region of the plurality of Q-switch regions,
the separation region is interposed in an extending direction of the ridge part,
the separation region includes a separation groove that separates, by a space, a gain region of the plurality of gain regions from a Q switch region of the plurality of Q-switch regions adjacent to the gain region, and
the separation groove has a bottom surface at a position, in the second semiconductor layer, higher than a part corresponding to a foot of each side of both sides of the ridge part.

2. The semiconductor laser according to claim 1, wherein the second semiconductor layer includes a first different-composition-ratio semiconductor layer having a composition ratio different from a composition ratio of a remaining part of the second semiconductor layer, and
the bottom surface of the separation groove is a portion of a top surface of the first different-composition-ratio semiconductor layer.

3. The semiconductor laser according to claim 2, wherein the second semiconductor layer includes a second different-composition-ratio semiconductor layer having a composition ratio different from the composition ratio of the remaining part of the second semiconductor layer, and
a top surface of the part corresponding to the foot of each side of both the sides of the ridge part is a portion of a top surface of the second different-composition-ratio semiconductor layer.

4. The semiconductor laser according to claim 3, wherein each of the bottom surface of the separation groove and the top surface of the part corresponding to the foot of each side of both the sides of the ridge part is a surface formed by wet etching.

5. The semiconductor laser according to claim 1, wherein each Q-switch region of the plurality of Q-switch regions includes an interface between the second semiconductor layer and the third semiconductor layer at a position higher than the part corresponding to the foot of each side of both the sides of the ridge part.

6. The semiconductor laser according to claim 1, wherein the second semiconductor layer includes a first impurity diffusion region of the second conductivity type at a part corresponding to each gain region of the plurality of gain regions, and
each gain region of the plurality of gain regions includes a p-n junction at a position lower than the part corresponding to the foot of each side of both the sides of the ridge part.

7. The semiconductor laser according to claim 6, wherein the second semiconductor layer includes a second impurity diffusion region of the second conductivity type at a part corresponding to each Q-switch region of the plurality of Q-switch regions, and
each Q-switch region of the plurality of Q-switch regions includes a p-n junction at a position lower than the part corresponding to the foot of each side of both the sides of the ridge part.

8. The semiconductor laser according to claim 1, wherein, in the bottom surface of the separation groove, a height of a middle part in a width-direction of the ridge part is higher than a height of a part close to the foot of each side of both the sides of the ridge part.

9. The semiconductor laser according to claim 8, wherein, in the separation groove, a width of the middle part in the width-direction of the ridge part is narrower than a width of the part close to the foot of each side of both the sides of the ridge part.

10. The semiconductor laser according to claim 1, wherein, in the separation groove, a width of a middle part in a width-direction of the ridge part is narrower than a width of a part close to the foot of each side of both the sides of the ridge part.

11. The semiconductor laser according to claim 1, wherein
in each gain region of the plurality of gain regions, an end surface facing the separation region includes one or more convex shapes in a width-direction of the ridge part, and
in each Q-switch region of the plurality of Q-switch regions, an end surface facing the separation region includes one or more concave shapes that approximately follow the one or more convex shapes.

12. The semiconductor laser according to claim 1, wherein, in each gain region of the plurality of gain regions and each Q-switch region of the plurality of Q-switch regions, an end surface facing the separation region has a configuration having a distribution of a refractive index from the gain region of the plurality of gain regions to the Q-switch region of the plurality of Q-switch regions.

13. The semiconductor laser according to claim 12, wherein, in one or both of each gain region of the plurality of gain regions and each Q-switch region of the plurality of Q-switch regions, the end surface facing the separation region has one of a convex shape, a concave shape, or a concavo-convex shape in a width-direction of the ridge part.

14. An electronic apparatus, comprising:
a semiconductor laser as a light source, the semiconductor laser including:
a semiconductor substrate;
a first semiconductor layer of a first conductivity type;
an active layer;
a second semiconductor layer of the first conductivity type;

a third semiconductor layer of a second conductivity type, wherein the first semiconductor layer of the first conductivity type, the active layer, the second semiconductor layer of the first conductivity type, and the third semiconductor layer of the second conductivity type are in respective order on the semiconductor substrate; and a ridge part in the second semiconductor layer and the third semiconductor layer, wherein the ridge part extends in a stacked in-plane direction, the ridge part has a structure in which a plurality of gain regions and a plurality of Q-switch regions are each disposed alternately and a separation region is interposed between each gain region of the plurality of gain regions and each Q-switch region of the plurality of Q-switch regions, the separation region is interposed in an extending direction of the ridge part, the separation region includes a separation groove that separates, by a space, a gain region of the plurality of gain regions from a Q switch region of the plurality of Q-switch regions adjacent to the gain region, and the separation groove has a bottom surface at a position, in the second semiconductor layer, higher than a part corresponding to a foot of each side of both sides of the ridge part.

15. The electronic apparatus according to claim 14, further comprising a drive section configured to:

drive the semiconductor laser;

apply a forward bias pulse voltage to the gain region of the plurality of gain regions; and apply a reverse bias to the Q-switch region of the plurality of Q-switch regions.

16. A method of driving a semiconductor laser, the method comprising:

applying a forward bias pulse voltage to a gain region of a plurality of gain regions in a ridge part of the semiconductor laser; and applying a reverse bias to a Q-switch region of a plurality of Q-switch regions in the ridge part of the semiconductor laser, wherein the semiconductor laser comprises:

a semiconductor substrate;

a first semiconductor layer of a first conductivity type;

an active layer;

a second semiconductor layer of the first conductivity type;

a third semiconductor layer of a second conductivity type, wherein the first semiconductor layer of the first conductivity type, the active layer, the second semiconductor layer of the first conductivity type, and the third semiconductor layer of the second conductivity type are in respective order on the semiconductor substrate; and the ridge part in the second semiconductor layer and the third semiconductor layer, wherein the ridge part extends in a stacked in-plane direction, the ridge part has a structure in which the plurality of gain regions and the plurality of Q-switch regions are each disposed alternately and a separation region is interposed between each gain region of the plurality of gain regions and each Q-switch region of the plurality of Q-switch regions, the separation region is interposed in an extending direction of the ridge part, the separation region includes a separation groove that separates, by a space, the gain region of the plurality of gain regions from the Q-switch region of the plurality of Q-switch regions adjacent to the gain region, and the separation groove has a bottom surface at a position, in the second semiconductor layer, higher than a part corresponding to a foot of each side of both sides of the ridge part.

17. The method of driving the semiconductor laser according to claim 16, wherein the forward bias pulse voltage has a pulse width of a nano-second order.

* * * * *